(12) United States Patent
Weinfurtner

(10) Patent No.: US 6,181,639 B1
(45) Date of Patent: Jan. 30, 2001

(54) METHOD AND APPARATUS FOR A FLEXIBLE CONTROLLER FOR A DRAM GENERATOR SYSTEM

(75) Inventor: Oliver Weinfurtner, Wappingers Falls, NY (US)

(73) Assignee: Infineon Technologies North America Corp., San Jose, CA (US)

(*) Notice: Under 35 U.S.C. 154(b), the term of this patent shall be extended for 0 days.

(21) Appl. No.: 09/534,104

(22) Filed: Mar. 23, 2000

(51) Int. Cl.$^7$ ........................................... G11C 8/00
(52) U.S. Cl. ................................. 365/233; 365/239
(58) Field of Search ........................ 365/233, 239

(56) References Cited

U.S. PATENT DOCUMENTS 5,301,287 * 4/1994 Herrell et al. ................... 365/233
5,933,385 * 8/1999 Jiang et al. ....................... 365/239

* cited by examiner

Primary Examiner—Trong Phan
(74) Attorney, Agent, or Firm—Stanton Braden

(57) ABSTRACT

In a controller for controlling a generator system on a memory chip, the controller operates as a state machine in accordance with a state diagram including a plurality of X states. An evaluation arrangement evaluates a combination of only a predetermined one of a plurality of N input signals from remote devices, and only a predetermined one of a plurality of X state signals indicating a current state in the state diagram at any instant of time. The controller generates a plurality of Y output signals having a predetermined logical value that indicates that a change from one state to a next state in the state diagram is to be made when the predetermined one of both the plurality of N input signals and the plurality of X state signals comprise a predetermined logical value. A state storage device is responsive to the predetermined one of a plurality of Y output signals having a predetermined logical value, and generates a revised plurality of X state output signals for transmission back to the evaluation arrangement indicating a change in the state diagram from a current state to a next state of the plurality of X states. An output arrangement is responsive to the revised plurality of X state output signals for generating separate predetermined ones of M output signals to remote devices associated with said next state for controlling the generator system.

46 Claims, 13 Drawing Sheets

US 6,181,639 B1

METHOD AND APPARATUS FOR A FLEXIBLE CONTROLLER FOR A DRAM GENERATOR SYSTEM

CROSS-REFERENCE TO RELATED APPLICATIONS

This application is related to and drawn from Provisional Application Ser. No. 60/079,717, filed Mar. 27, 1998, and U.S. patent application Ser. No. 09/253,996, filed Feb. 22, 1999, and having the same inventor and assignee.

This application is also related to co-pending applications entitled "Method and Apparatus For An Improved Reset And Power-On Arrangement For A DRAM Generator Controller", "Method and Apparatus for A Flexible Controller Including An Improved Output Arrangement For A DRAM Generator Controller", and "Method and Apparatus For An Easy Identification Of A State Of A DRAM Generator Controller" which are filed on the same date as the present application, and have the same inventor and assignee.

1. Field of the Invention

The invention relates to method and apparatus for a controller circuit for a generator system in a Dynamic Random Access Memory (DRAM) that is very flexible, and its functionality can easily be adjusted to the generator system.

2. Background of the Invention

Modern DRAM chips have many different voltages (e.g., more than 10) on-chip that have to be generated by a plurality of generator circuits. These voltages include several reference voltages (e.g., for receiver circuits and for bias current generation) as well as several voltages that supply various functional blocks on the chip with operating current (e.g., voltages for sense amplifiers and word line drivers). All of these voltages are generated from one external source voltage by the plurality of generator circuits.

There are basically three operating modes which occur for the voltage generating circuits. These modes are (1) a normal operating phase, (2) a test and burn-in phase, and (3) a power-on phase. In each of these modes the generator system operates in a different way, and needs to be controlled in a specific way. A controller for the generator system has to ensure a proper coordination of all generator functions for each of the various modes. More particularly, once the external source voltage (VEXT) is applied to the DRAM chip, the generator system goes through a power-on phase. After the power-on phase, all voltages on the DRAM chip are stable, and the generator system (and the whole chip) enters the normal operating phase. For burn-in and for test purposes, a multitude of additional functions have to implemented into the generator system.

The problem is that the overall logic behavior of the generator system, and its controller, is relatively complex. This is especially true during a late phase of a design project as all of the sub-systems are being put together, and it is very likely that changes in the logic functionality of the controller have to be made. In a current one-Gigabit (GB) chip, known by the designation ZEUS DD1, logic control functions of a generator system therein were clearly separated from the voltage generating functions. The logic behavior of the generator system is implemented in a digital controller (a finite state machine). In order to realize a finite state machine, design and layout synthesis was used in the one-GB Dynamic Random Access Memory (DRAM) chip. The logic behavior therein was specified in a truth table, and the concept was to create circuitry automatically within a short time by using the respective software tools. Thus, changes or corrections of the controller could theoretically be performed within a few hours, even in a late stage of a project.

Problems in existing solutions are that both design and layout synthesis tools do not provide a required solution to many problems for providing a flexible and fast controller design. For example, the design synthesis tool demanded a large amount of time for learning the handling and functionality of the tool, and this tool made manual corrections and working around of problems necessary. The layout synthesis tool created results that contained errors and required manual inspections and corrections. Additionally, one could not provide timing constraints to inputs to the tool for generating certain voltages which required manual checks of a synthesized layout for a critical path which then required manual corrections. Therefore, it is desirable to provide a technique where changes in the logic behavior of the controller is obtainable in a systematic and very quick manner.

The present invention provides a controller circuit for a generator system that is very flexible so that its functionality can easily be adjusted to a specific generator system to allow for last minute changes of the behavior of a generator circuit.

SUMMARY OF THE INVENTION

The present invention is directed to a controller circuit for a generator system located on a chip such as a Dynamic Random Access Memory (DRAM). The specific behavior of the present controller circuit is made very flexible so that its functionality can easily be adjusted to the specific associated generation system and permit quick "last-minute-changes" in the controller circuit's behavior.

Viewed from one aspect, the present invention is directed to a controller for controlling a generator system on a memory chip, the controller operating as a state machine in accordance with a state diagram including a plurality of X states. The controller comprises an evaluation arrangement, a state storage device, and an output arrangement. The evaluation arrangement evaluates a combination of only a predetermined one of a plurality of N input signals from remote devices and only a predetermined one of a plurality of X state signals indicating a current state in the state diagram for the controller at any instant of time. In turn, the evaluating arrangement generates a separate predetermined one of a plurality of Y output signals having a predetermined logical value which is different than that of the remaining plurality of Y output signals. The predetermined one of the Y output signals indicates that a change from one state to a next state in the state diagram is to be made when the predetermined one of the plurality of N input signals and the predetermined one of the plurality of X state signals comprise a predetermined logical condition. The state storage device is responsive to the predetermined one of a plurality of Y output signals having a predetermined logical value from the evaluation arrangement, and generates a revised plurality of X state output signals for transmission back to the evaluation arrangement indicating a change in the state diagram from a current state to a next state of the plurality of X states. The output arrangement is responsive to the revised plurality of X state output signals from the state storage device for generating separate predetermined ones of M output signals associated with said next state for controlling the generator system.

Viewed from another aspect, the present invention is directed to a controller for controlling a remote system on a memory chip which operates in accordance with a state diagram including a plurality of X states. The controller comprises an evaluation arrangement, a state storage device, and an output arrangement. The evaluation arrangement is responsive at any instant of time for evaluating only one of a plurality of N input signals to the controller from remote devices in relation to only one of a plurality of X state signals. The controller generates one of a plurality of Y output signals that has a predetermined logical value for entering a next state in the state diagram when a condition has been met wherein the one state signal and the one input signal have met predetermined logical conditions. The state storage device is responsive to the one of a plurality of Y output signals that has a predetermined logical value from the evaluation arrangement to generate a revised plurality of X state output signals for transmission back to the evaluation arrangement indicating a change in the state diagram from a current state to a next state of the plurality of X states. The output arrangement is responsive to the revised plurality of X state output signals from the state storage device for generating separate predetermined ones of M output signals associated with said next state for controlling the generator system.

Viewed from still another aspect, the present invention is directed to a method of controlling a generator system on a memory chip with a controller operating as a state machine in accordance with a state diagram including a plurality of X states. In a first step, only one of a plurality of N input signals from remote devices is evaluated in relation to only one of a plurality of X state signals in an evaluation arrangement at any instant of time. In a second step, one of a plurality of Y output signals is generated from the evaluation arrangement having a predetermined logical value indicating that a next state is to be entered in the state diagram. The one of a plurality of Y output signals is generated when a condition has been met wherein the one state signal and the one input signal that are being evaluated have met predetermined logical conditions. In a third step, a revised plurality of X state output signals is generated in a state storage device in response to the plurality of Y output signals from the evaluation arrangement in the second step for transmission back to the evaluation arrangement indicating a change in the state diagram from a current state to a next state of the plurality of X states. In a fourth step, separate predetermined ones of a plurality of M output signals are generated in an output arrangement that are associated with said next state for controlling the generator system in response to the revised plurality of X state output signals from the state storage device in the third step.

The invention will be better understood from the following more detailed description taken with the accompanying drawings and claims.

DETAILED DESCRIPTION

In the various figures, corresponding designation numbers represent corresponding elements.

Figure 1:
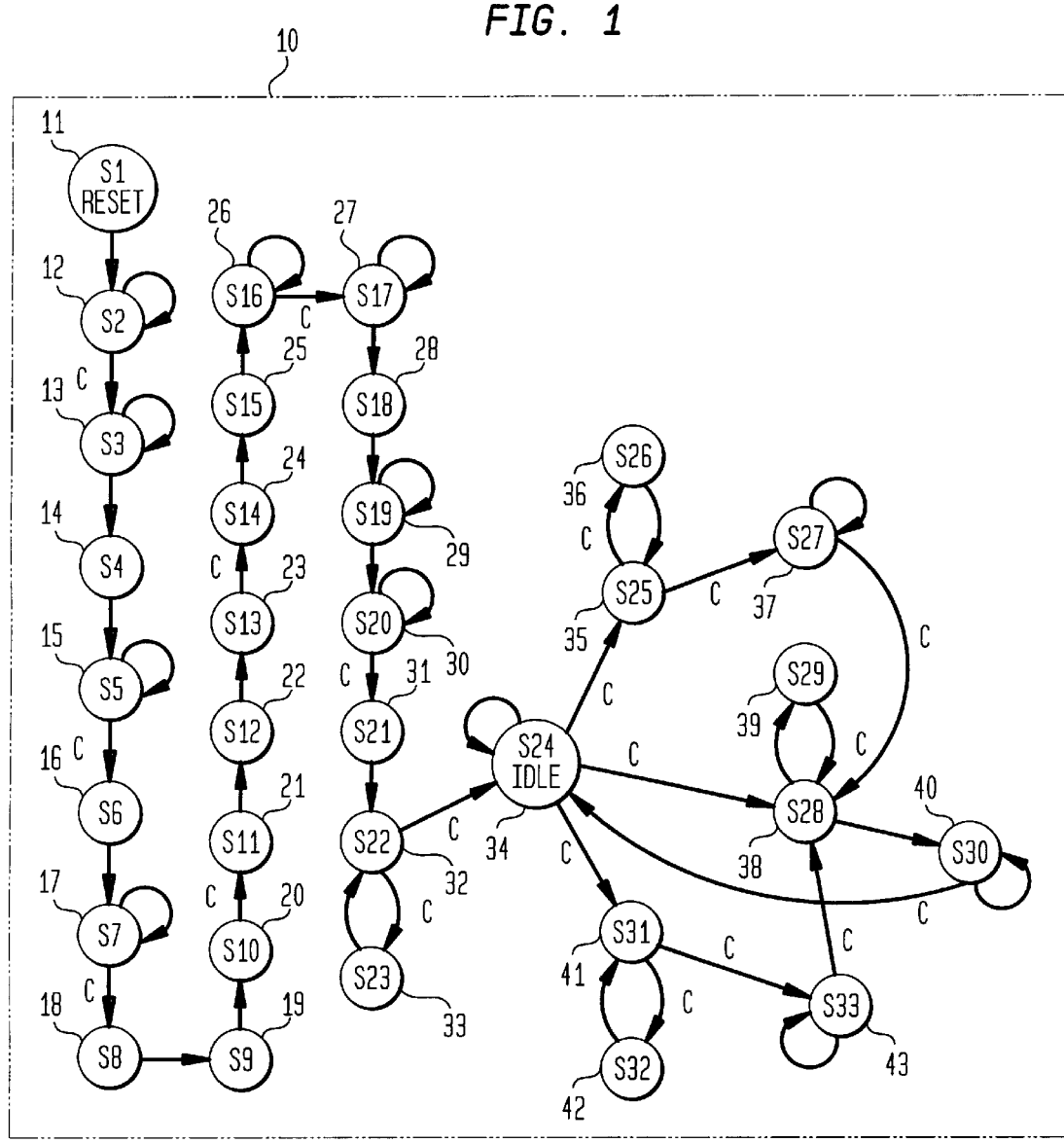
FIG. 1 is a general type of state diagram of a generator controller for use by a state machine of a generator controller to control a generator system of, for example, a prior art one-Gigabit (GB) Dynamic Random Access Memory (DRAM) chip.

Referring now to FIG. 1, there is shown a general type of state diagram 10 (shown within a dashed line rectangle) for use by a state machine of a generator controller to control a generator system (not shown) of, for example, a prior art 1-Gigabit (GB) Dynamic Random Access Memory (DRAM) chip (not shown). The state diagram 10 is shown as comprising a plurality of thirty-three states designated S1–S33 indicated within circles 11–43, respectively. It is to be understood that the state diagram 10 is exemplary only, and that state machines can have any logical behavior and routing through a state diagram depending on the generator system to be controlled. Therefore, a state diagram can have any number of states arranged in a predetermined sequence to permit a state machine to achieve a proper control sequence of each operational mode of a generator system on an associated DRAM chip. In the state diagram 10, each of the states S1–S33 indicates a state wherein a certain function is performed, and a "C" at an output of a particular state indicates that a predetermined Condition must occur for a transition out of that state.

In a typical operation, when an external supply voltage is powered up and supplied to the DRAM chip, the state machine is forced into a RESET state as indicated for state S1 within circle 11. After the state machine is initialized in state S1, the state machine generally goes into a Power-Up mode and proceeds through a sequence of states S2 to S24 shown by circles 12–34, respectively. The Power-Up mode sequence through states S2–S24, for example, coordinates a sequential turning-on of all generator subsystems (not shown). More particularly, as the state machine proceeds through the state diagram 10, predetermined ones of the states S2–S24 will turn-on one or more of the generator subsystems within the generator system (not shown). All conditional transitions in the state diagram 10 are marked with a "C" next to a transition arrow leading out of that state. The "C" indicates that the state machine stays in the respective state until one (or more) input signal (not shown) take on a required value as, for example, an input signal is in a "low" (typically a "0") or a "high" state (typically a "1"), or the input has reached at a specified threshold level. Only then does the transition to a next state occur.

Once in the Reset state S1 shown in circle 11, an unconditional transition occurs into state S2 shown by circle 12 since no condition "C" is shown at the output of state S1. In state S2 shown by circle 12, the sequence of the state diagram 10 remains in state S2 until a specific condition "C" occurs as is indicated at the output of state S2. Once the condition "C" is detected by the state machine, the state machine proceeds to state S3 shown by circle 13. The output of state S3 does not have a required input signal condition before transitioning to state S4 shown by circle 14 and, may, for example, just cause a predetermined delay. State S4 also does not have a Condition for a transition into state S5 shown by circle 15 and may, for example, turn on a predetermined generator in the generator system. As the state machine proceeds through the state diagram 10, it generates, for example, 20 output signals (not shown) which have specific values by which it controls the generator sub-systems. At the end of the Power-Up mode sequence, the state machine stays in an IDLE mode indicated by state S24 shown by circle 34. When certain test or configuration operations need to be performed, the state machine transits through some or all of the respective sequences of states S25–S33 indicated by circles 35–43, respectively, and the path directions as is required by each operation, and then returns to the IDLE mode at state 24 shown by circle 34.

Although there are some variations to the structure of a state diagram from design to design, and although added functionality is likely to be expected for further projects, state diagram 10 can be regarded as fairly typical for application to a generator controller in a DRAM chip. The typical state diagram 10 is characterized by the following aspects. First, the state diagram has a linear structure over large portions of the diagram which indicates that most states have only one predecessor state and only one successor state. Second, when successor branching occurs (more than one potential successor to a state), then there are, in most cases, not more than two potential successor states. Third, when predecessor branching occurs, then there are, in most cases, not more that two potential predecessors to each state. Fourth, most conditional (C) transitions between two states depend on one input variable. Fifth, the state diagram 10 generally has forty to sixty states, ten to twenty input signals, and twenty to twenty-five output signals.

To enable implementation of a universally programmable state machine in accordance with the present invention, the state machine needs to comprise very basic building blocks and predetermined transformations in the state diagram. The basic structure of such state machine only allows the implementation of (a) states with only one exit condition (C) which means that in every state only one input signal can be evaluated with the consequence that every state can have only one conditional successor, and (b) states that have no more than two predecessors.

Figure 2:
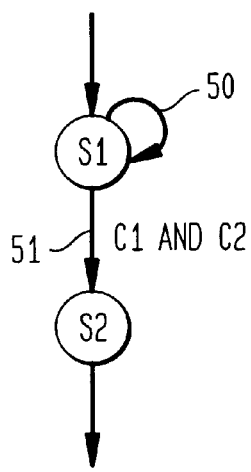
FIGS. 2 and 3 show separate exemplary arrangements of a partial state diagram for a transition from a first state to a second state on two logically AND-combined input variables.
Figure 3:
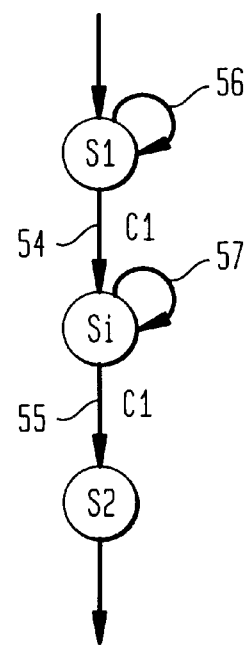

Referring now to FIGS. 2 and 3, there is shown separate exemplary arrangements of a partial state diagram for a transition from a first state S1 to a second state S2 on two logically AND-combined input variables (not shown). In FIG. 2, within the state S1 an evaluation of each of first and second input variables is made and only when each of the first and second variables obtain a predetermined condition C1 AND C2, respectively, will there be a transition 51 from state S1 to state S2. Until such predetermined condition of C1 AND C2 exists, state S1 continuously re-evaluates the conditions of the first and second input variables, as is indicated by the loop 50, until the state machine detects that the input variables thereto meet the predetermined condition of C1 AND C2. Then a transition to state S2 is performed.

In FIG. 3, the arrangement of FIG. 2 is transformed into a sequence of two transitions where a first transition 54 is from state S1 to an intermediate state Si, and a second transition 55 is from state Si to a state S2. In this arrangement, each transition 54 or 55 depends on only one input variable (not shown) meeting only one condition. More particularly, a first input variable is provided to state S1 where it is continuously evaluated, as is indicated by loop 56, until it meets a predetermined condition C1 (e.g., the input variable is high). At this time there is a transition in the state diagram to state Si. State Si continuously evaluates, as is indicated by loop 57, a second input variable until that second variable meets a predetermined condition C2 (e.g., the input variable is high). At this time there is a transition from state Si to state S2. In each of FIGS. 2 and 3, the transition to state S2 requires that both conditions C1 AND C2 exist before a transition is made to state S2. The difference between FIGS. 2 and 3 is that the implementation of the hardware in the associated state machine is different where the arrangement of FIG. 3 is a simple hardware implementation.

Figure 4:
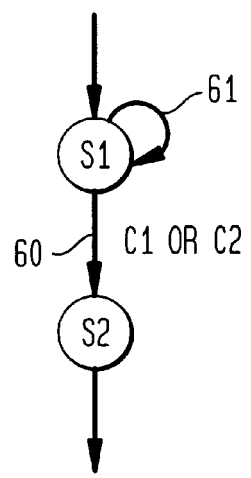
FIGS. 4 and 5 show separate exemplary arrangements of a partial state diagram for a transition for a first state to a second state on two logically OR-combined input variables.
Figure 5:
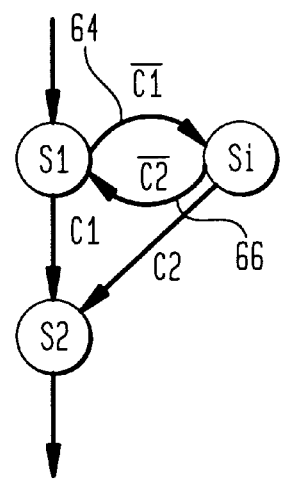

Referring now to FIGS. 4 and 5, there is shown separate exemplary arrangements of a partial state diagram for a transition for a first state to a second state based on two logically OR-combined input variables. In FIG. 4, in state S1 an evaluation of each of first and second variables (not shown) is made. When the first or second variable obtains a predetermined condition of C1 OR C2, respectively, a transition 60 from state S1 to state S2 occurs. Until such predetermined condition of C1 OR C2 exists, state S1 continuously re-evaluates the conditions of the first and second variables, as is indicated by the loop 61, until state S1 finds that the input variables meet the predetermined condition of C1 OR C2.

In FIG. 5, the arrangement of FIG. 4 is transformed into an arrangement of three states S1, Si, and S2 wherein a parallel evaluation of first and second input variables (not shown) is performed. State S1 evaluates the first input variable to determine if a condition C1 is met by the first input variable, and state Si evaluates the second input variable to determine if a condition C2 is met by the second input variable. In operation, state S1 initially determines whether the condition C1 is met, and if condition C1 is met the state machine immediately goes to state S2. If condition C1 is not met in state S1, an inverted C1 signal is sent to state Si via path 64 to cause state Si to evaluate the second input variable to determine if the second input variable meets the condition C2. If condition C2 is met in state Si, the state machine transitions to state S2. If condition C2 is not met, control is returned via path 66 from state Si to state S1. This cycling between states S1 and Si repeats until either one of the conditions C1 OR C2 is met. This transformation principle shown in FIG. 5 can be extended to more than two OR-combined input variables by the inclusion of more intermediate states in parallel with states S1 and Si. Under such arrangement, the state machine would cycle through all of the intermediate states (states S1, Si, etc) until one input variable meets its stated condition "C" before transitioning to state S2. The difference between FIGS. 4 and 5 is that the implementation of the hardware in the associated state machine is different and simpler for the arrangement of FIG. 5.

Figure 6:
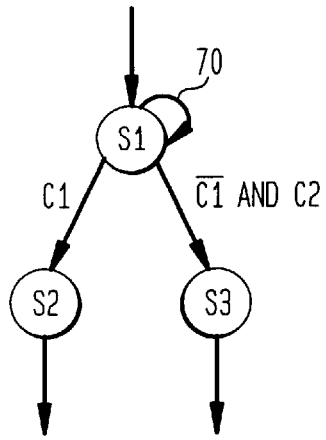
FIGS. 6 and 7 show separate exemplary state transitions in a partial state diagram for a conditional branching from a first state into two potentially successor second and third states.
Figure 7:
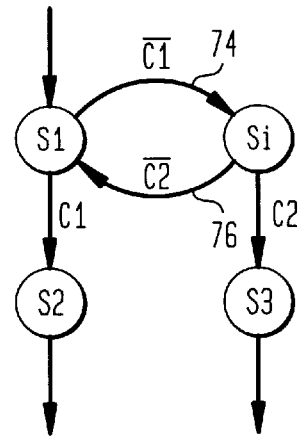

Referring now to FIGS. 6 and 7, there is shown separate exemplary state transitions in a partial state diagram for a conditional branching from a first state S1 into two potentially successor second and third states S2 and S3. In FIG. 6, state S1 evaluates first and second input variables (not shown), and if the first input variable meets a condition C1, the state machine transitions to state S2. If the first input variable does not meet the condition C1 and the second input variable meets a condition C2, the state machine transitions from state S1 to state S3. If both of the first input variable and the second input variables do not meet the condition of C1 and C2, respectively, then state S1 loops through the sequence again as is indicated by the loop 70 until a condition C1 or C2 is met to transition either to state S2 or state S3, respectively.

In FIG. 7, the arrangement of FIG. 6 is transformed into an arrangement of four states S1, Si, S2, and S3 wherein a parallel evaluation of two input variables (not shown) are performed. In operation, state S1 initially determines whether a condition C1 is met, and if condition C1 is met the state machine immediately transitions to state S2. If condition C1 is not met in state S1, an inverted C1 signal is sent to state Si via path 74 to cause state Si to evaluate the second input variable to determine if the second input variable meets a condition C2. If condition C2 is met, the state machine then transitions to state S3. If condition C2 is not met, control is returned via path 76 from state Si to state S1. The cycling between states S1 and Si repeats until either one of the conditions C1 or C2 is met. This transformation principle can be extended to more than two potential successor states by the addition of more intermediate states (Si) in parallel. In such arrangement, the state machine would cycle through all of the intermediate states Si until one of the more than two input variables would meet its condition (C) before the state machine goes into the respective successor state.

Figure 8:
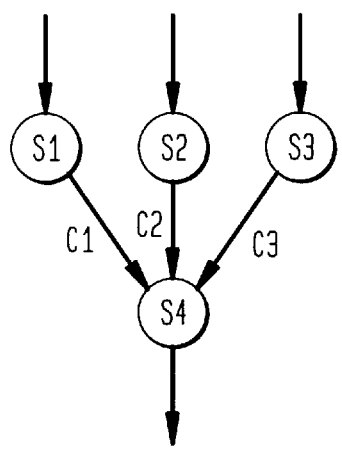
FIGS. 8 and 9 show separate exemplary state transitions in a partial state diagram where three states have a common successor state.
Figure 9:
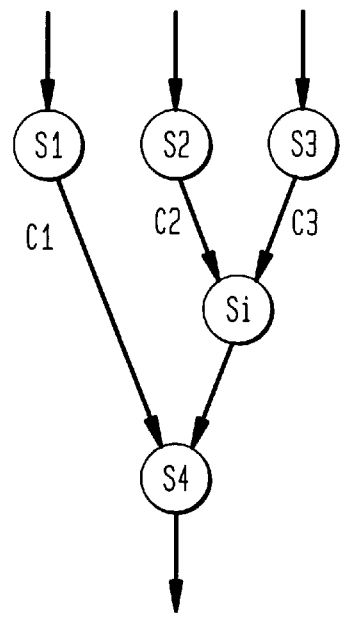

Referring now to FIGS. 8 and 9, there is shown separate exemplary state transitions in a partial state diagram where three states S1, S2, and S3 have a common successor state S4. In FIG. 8, first, second, and third input variables (not shown) are evaluated in parallel by states S1, S2, and S3, respectively. If State S1 determines that the first input variable meets a condition C1, the state machine transitions directly to state S4. Similarly, if state S2 or S3 determines that the second or third input variable, respectively, meets a respective condition C2 or C3, the state machine transitions directly to state S4.

In FIG. 9, the arrangement of FIG. 8 is transformed into an arrangement of five states S1, S2, Si, S3, and S4. A parallel evaluation of first, second, and third input variables is performed in states S1, S2, and S3. In operation, state S1 initially determines whether a condition C1 is met, and if condition C1 is met the state machine immediately transitions to state S4. State S2 determines whether a condition C2 is met, and if condition C2 is met the state machine immediately transitions to state Si. Similarly, state S3 determines whether a condition C3 is met, and if condition C3 is met the state machine immediately transitions to state Si. The transition from state Si to state S4 occurs unconditionally upon detection of a transition from states S2 and/or S3.

FIGS. 2–8 describe transformations which provide a "universal" state diagram, as is shown in FIGS. 3, 5, 7, and 9, that comprise only a few basic hardware elements. A penalty for these transformations from FIGS. 2, 4, 6, and 8 (which include complex conditions) to FIGS. 3, 5, 7, and 9 (which include sequential simple conditions) is an introduction of one or more intermediate states Si. The advantage of the arrangements of FIGS. 3, 5, 7, and 9 is that they comprise vary basic building blocks which only allow (a) states with only one exit condition (C) which means that in every state only one input signal can be evaluated with the consequence that every state can have only one conditional successor, and (b) states that have no more than two predecessors.

Figure 10:
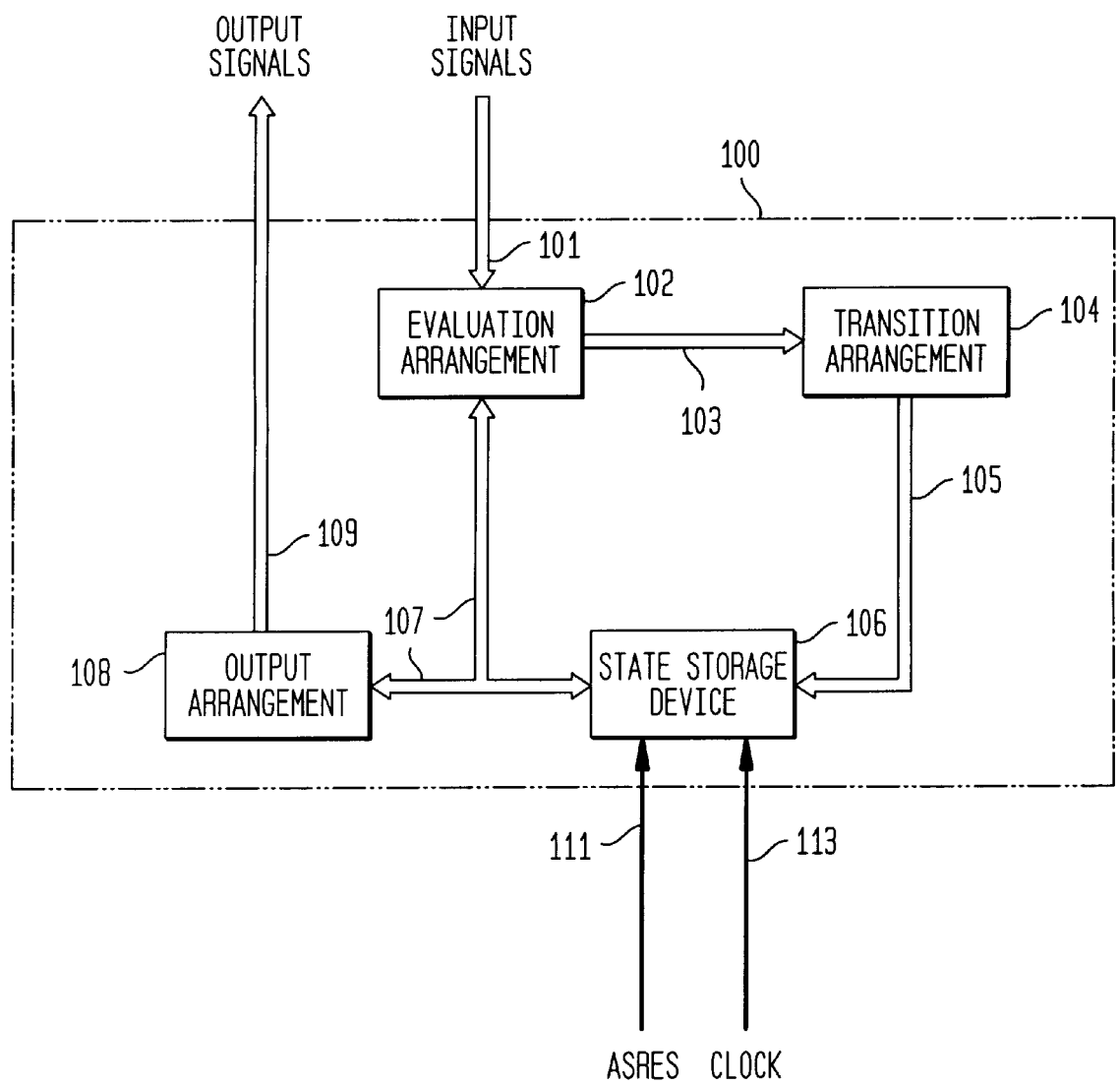
FIG. 10 shows a block diagram of a controller for a generator system of a Dynamic Random Access Memory (DRAM) chip in accordance with the present invention.

Referring now to FIG. 10, there is shown a block diagram of an exemplary controller 100 (shown within a dashed line rectangle) for a generator system (not shown) of, for example, a Dynamic Random Access Memory (DRAM) chip (not shown) in accordance with the present invention. The controller 100 comprises an evaluation arrangement 102, a transition arrangement 104, a state storage device 106, an output arrangement 108, and buses 101, 103, 105, 107, and 109 which are shown by bold lines. Input signals are received by the evaluation arrangement 102 via the bus 101 and the bus 107, and it generates output signals which are transmitted over bus 103 to the transition arrangement 104. The transition arrangement 104, which is responsive to the output signals it receives from the evaluation arrangement 102, generates output signals which are transmitted to the state storage device 106 via bus 105. The state storage device 106 receives as inputs the output signals from the transition arrangement 104 via bus 105, and externally generated Reset and Clock signals via leads 111 and 113, respectively. The state storage device 106 is responsive to the received input signals and generates output signals which are transmitted via bus 107 to inputs of both the Evaluation arrangement 102 and the output arrangement 108. The output arrangement 108 generates output signals which are transmitted via the bus 109 to remote devices such as generators of a generator system. An external power source (not shown) provides a predetermined potential VEXT to the controller 100 via lead 114 for use in the evaluation arrangement 102, the transition arrangement 104, and the output arrangement 108. The operation of the controller 100 will described hereinbelow in regard to FIGS. 11–14.

Figure 11:
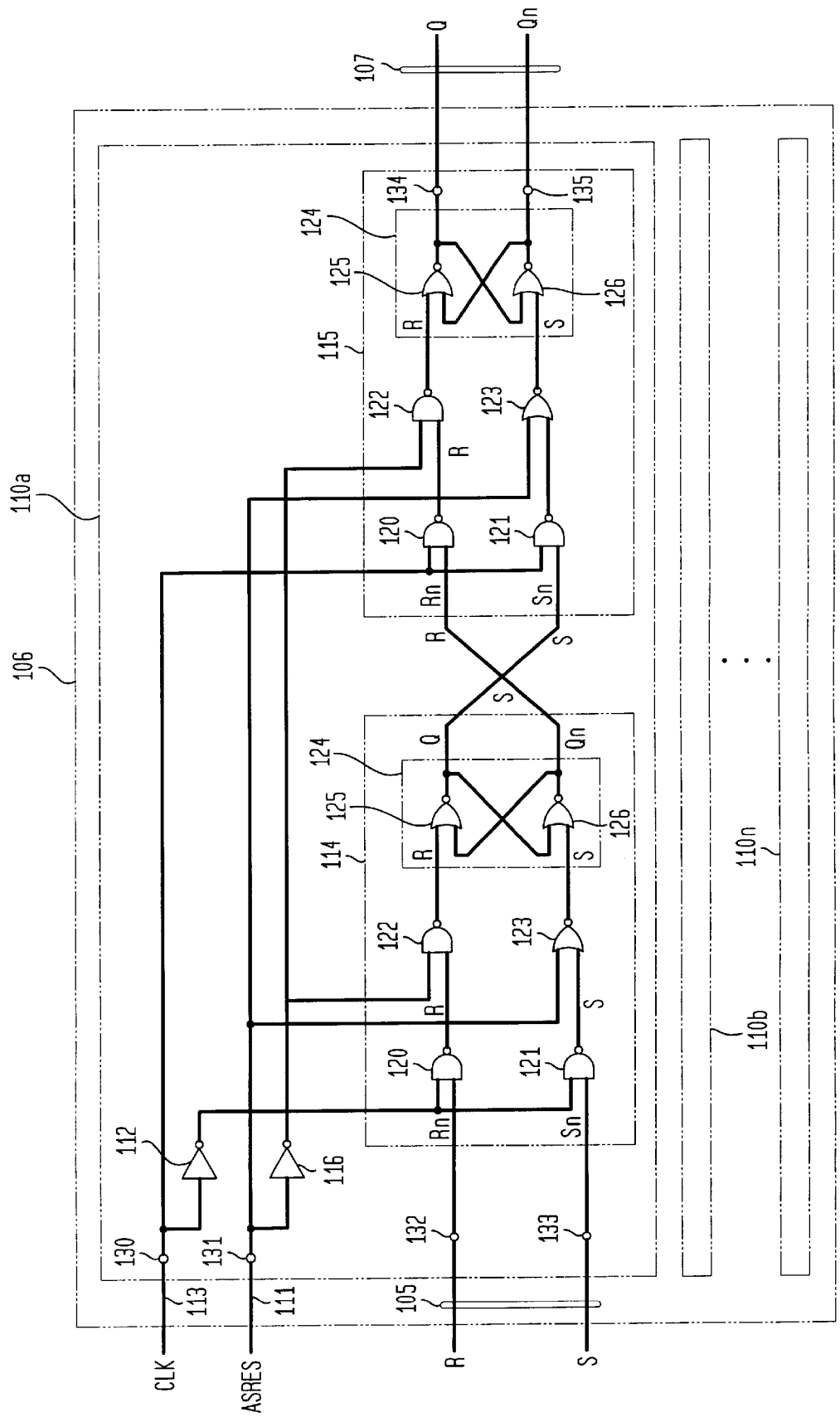
FIG. 11 shows a circuit diagram for one of a plurality of corresponding exemplary Set-Reset-Master-Slave Flip-Flops for use in an exemplary state storage device forming part of the controller of FIG. 10 in accordance with the present invention.

Referring now to FIG. 11, there is shown an exemplary arrangement of a state storage device 106 (shown within a dashed line rectangle) forming part of the controller 100 of FIG. 10 in accordance with the present invention. The state storage device 106 comprises a plurality of N Set-Reset-Master-Slave Flip-Flop (SR-MS-F/F) circuits 110a to 110n (of which only shown only SR-MS-F/F circuits 110a, 110b, and 110n are shown within a separate dashed line rectangle) with asynchronous reset (ASRES). The SR-MS-F/F circuit 110a is enlarged to show a circuit diagram for an exemplary SR-MS-F/F circuit 110 with asynchronous reset (ASRES). The remaining SR-MS-F/F circuits 110b–110n are similarly configured and function in the same manner is described hereinbelow for SR-MS-F/F circuit 110a.

For an understanding of the operation of the controller 100, the number (N) of state signals equals the number of states (S) in a state diagram as shown, for example, in FIG. 1. This means that a 1-out-of-N coding is used for the controller 100, and every state (S) is represented by one bit in a state vector. When a state (S) is active, the associated bit in the state vector for that state is high (logically high) and all of the other bits in the state vector are low (logically low). Each of the N state bits is stored by a separate one of the SR-MS-F/F circuits 110a–110n.

The SR-MS-F/F circuit 110a comprises first and second inverters 112 and 116, and first and second Set-Reset (S-R) flip-flop (F/F) stages 114 and 115 (each shown within a separate dashed line rectangle). Each of the S-R F/F stages 114 and 115 comprises first, second, and third two-input NAND gates 120, 121, and 122, respectively, a two-input NOR gate 123, and a NOR-S-R flip flop 124 (shown within a dashed line rectangle) comprising first and second two-input NOR gates 125 and 126. A clock (CLK) signal is received at an input terminal 130 of the SR-MS-F/F circuit 110a via a lead 113 and coupled to a first input of each of the first and second NAND gates 120 and 121 in the first S-R F/F stage 114 via the first inverter 112, and directly to first inputs of the first and second NAND gates 120 and 121 in the second S-R F/F stage 115. A Reset (R) signal is received at an input terminal 132 of the SR-MS-F/F circuit 110a via bus 105 and coupled to a second input of the first NAND gate 120 in the first S-R F/F stage 114. A Set (S) signal is received at an input terminal 133 of the SR-MS-F/F circuit 110a via bus 105 and coupled to a second input of the second NAND gate 121 in the first S-R F/F stage 114. An Asynchronous Reset (ASRES) signal is received at an input terminal 131 of the SR-MS-F/F circuit 110a via lead 111 and coupled to a first input of the third NAND gate 122 in each of the first and second S-R F/F stages 114 and 115 via the second inverter 116, and directly to a first inputs of the NOR gate 123 in each of the first and second S-R F/F stages 114 and 115. Outputs from the first and second NAND gates 120 and 121 in each of the first and second S-R F/F stages 114 and 115 are coupled to second inputs of the third NAND gate 122 and NOR gate 123, respectively, in the associated first and second S-R F/F stage 114 and 115. Outputs from the third NAND gate 122 and the NOR gate 123 in each of the first and second S-R F/F stages 114 and 115 are coupled to first inputs of the first and second NOR gates 125 and 126 in the associated NOR-S-R flip-flop 124. An output (Q) of the first NOR gate 125 in the NOR-S-R flip flop 124 of the first S-R F/F stage 114 is coupled to a second input of the second NOR gate 126 in the first S-R F/F stage 114, and to a second input of the second NAND gate 121 in the second S-R F/F stage 115. An output (Qn) of the second NOR gate 126 in the NOR-S-R flip-flop 124 of the first S-R F/F stage 114 is coupled to a second input of the first NOR gate 125 in the first S-R F/F stage 114, and to a second input of the first NAND gate 120 in the second S-R F/F stage 115. The output (Q) of the first NOR gate 125 in the NOR-S-R flip-flop 124 of the second S-R F/F stage 115 is coupled to a second input of the second NOR gate 126 in the second S-R F/F stage 115 and to an output terminal 134 from the SR-MS-F/F circuit 110a. The output (Qn) of the second NOR gate 126 in the NOR-S-R flip-flop 124 of the second S-R F/F stage 115 is coupled to a second input of the first NOR gate 125 in the second S-R F/F stage 115, and to an output terminal 135 from the SR-MS-F/F circuit 110a.

In operation, the SR-MS-F/F circuit 110a is asynchronously resettable.

When the SR-MS-F/F circuit 110a receives an ASRES signal at input terminal 131 which is high (e.g., a logical "1"), both of the S-R F/F stages 114 and 115 are immediately set to low (e.g., a logical "0"), independently from what is received in the Set and Reset input signals at input terminals 132 and 133 and the clock signal at input terminal 130. This asynchronous reset function is needed in order to ensure proper reset of each of the SR-MS-F/F circuits 110a–110n in the state storage device 106 at the beginning of a power-on mode sequence. When the ASRES input signal is low (logical "0"), the SR-MS-F/F circuit 110a operates as follows. While the clock signal is low, the first S-R F/F stage 114 is controlled by the Set (S) and Reset (R) input signals, but the second S-R F/F stage 115 is locked. The information at is the output terminals 134 and 135 of the SR-MS-F/F circuit 110a are static and not dependent on the clock, Reset, or Set input signals. When the clock signal rises from a logical low to a logical high, the first S-R F/F stage 114 is locked and the second S-R F/F stage 115 is opened so that the current value stored in the NOR-S-R flip-flop 124 of the first S-R F/F stage 114 is transferred to the NOR-S-R flip-flop 124 of the second S-R F/F stage 115. A change in the Reset or Set input signals at terminals 132 or 133, respectively, will not affect the values stored in the SR-MS-F/F circuit 110a.

With each of the first and second stages 114 and 115 of the SR-MS-F/F circuit 110a comprising a NOR-S-R flip-flop 124, a truth table for the Set ($S_n$) signal at the input to NAND gate 120 of the S-R F/F stage 114, the Reset ($R_n$) signal at the input to NAND gate 121 of the S-R F/F stage 114, the Q signal at output terminal 134, and the Qn signal at output terminal 135 of the SR-MS-F/F circuit 110a is shown in Table 1.

TABLE 1

| $S_n$ | $R_n$ | Q OUT | Qn OUT |
|---|---|---|---|
| 0 | 0 | $Q_n$-1 | $Qn_n$-1 |
| 0 | 1 | 0 | 1 |
| 1 | 0 | 1 | 0 |
| 1 | 1 | (0) | (0) |

The subscripts "$_n$" and "$_{n-1}$" in Table 1 indicate the current state after input/output signals have changed, and a previous state before these signals changed, respectively. More particularly, a current input combination of S=0 and R=0 will not change the output signals Q and Qn. If both S and R become low, then Q and Qn both become low. However, if afterwards both S and R go high at the same time, then Q and Qn can no longer be predicted as indicated by the (0) designation in Table 1. This latter situation has to be avoided in order the maintain a well defined logical behavior of the SR-MS-F/F circuit 110a, and in accordance with the present invention, this situation is not able to occur.

Figure 12:
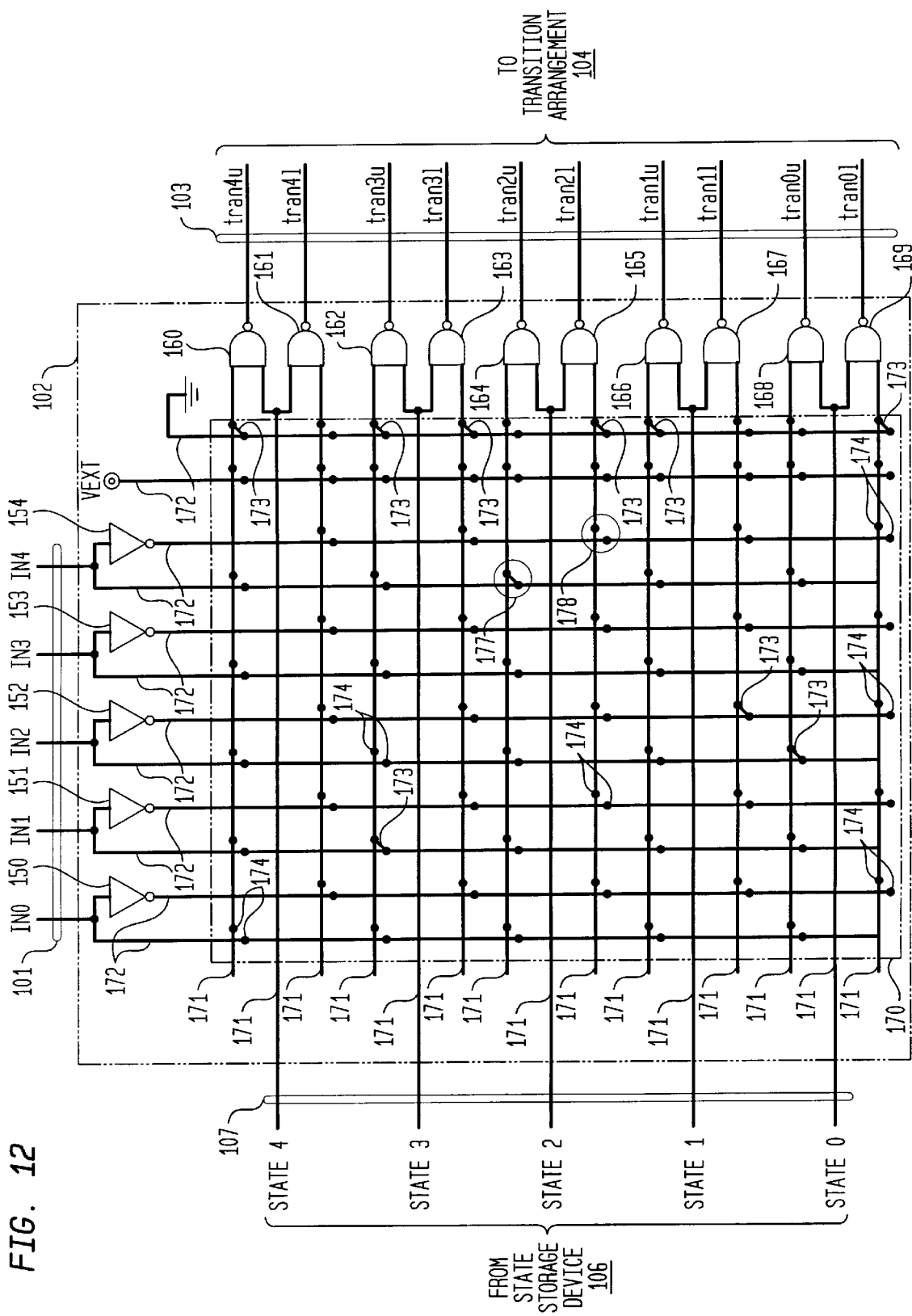
FIG. 12 shows a circuit diagram for an exemplary evaluation arrangement forming part of the controller of FIG. 10 in accordance with the present invention.

Referring now to FIG. 12, there is shown a circuit diagram for an exemplary evaluation arrangement 102 (show within a dashed line rectangle) forming part of the controller 100 of FIG. 10 in accordance with the present invention. The exemplary evaluation arrangement 102 is shown as receiving five state signals State 1–5 signals (State 0–4) and five input variable signals (IN0–IN4) which cause the arrangement to operate as is described hereinbelow. However, it is to be understood that the evaluation arrangement 102 can comprise many more input state and input variable signals that cause the evaluation arrangement 102 to operate in the same manner.

The exemplary evaluation arrangement 102 comprises five inverters 150–154, ten NAND gates 160–169, and a matrix 170 (shown within a dashed line rectangle) comprising fifteen parallel horizontal leads 171 that are connected to predetermined ones of twelve parallel vertical leads 172 by separate permanent connections 173 (shown with a solid line between two associated terminals). Unconnected associated terminals 174 are shown where permanent connections can be made if desired. More particularly, the IN0 input signal is received via bus 101 from a specific remote device (not shown) and coupled to the first vertical lead 172 of the matrix 170 and to the second vertical lead 172 of the matrix 170 by the first inverter 150. The IN1 input signal is received via bus 101 from a separate remote device (not shown) and coupled to the third vertical lead 172 of the matrix 170 and to the fourth vertical lead 172 of the matrix 170 by the second inverter 151. The IN2 input signal is received via bus 101 from a separate remote device (not shown) and coupled to the fifth vertical lead 172 of the matrix 170 and to the sixth vertical lead 172 of the matrix 170 by the third inverter 152. The IN3 input signal is received via bus 101 from a separate remote device (not shown) and coupled to the seventh vertical lead 172 of the matrix 170 and to the eighth vertical lead 172 of the matrix 170 by the fourth inverter 153. The IN4 input signal is received via bus 101 from a separate remote device (not shown) and coupled to the ninth vertical lead 172 of the matrix 170 and to the tenth vertical lead 172 of the matrix 170 by the fifth inverter 154. The eleventh vertical lead 172 is connected to a externally supplied voltage (VEXT), and the twelfth vertical lead 172 is connected to ground which is shown coupled through permanent connections 173 to the first, third, sixth, ninth, tenth, and fifteenth horizontal leads.

The State 4 input signal is received via bus 107 from the State Storage device 106 (shown in FIG. 10) and coupled to the second horizontal lead 171 at a first side of the matrix 170 and to first inputs of the first and second NAND gates 160 and 161 at a second opposite side on the matrix 170. The first and third horizontal leads 171 are connected to second inputs of the first and second NAND gates 160 and 161, respectively. The State 3 input signal is received via bus 107 from the State Storage device 106 and coupled to the fifth horizontal lead 171 at a first side of the matrix 170 and to first inputs of the third and fourth NAND gates 162 and 163 at a second opposite side on the matrix 170. The fourth and sixth horizontal leads 171 are connected to second inputs of the third and fourth NAND gates 162 and 163, respectively. The State 2 input signal is received via bus 107 from the State Storage device 106 and coupled to the eighth horizontal lead 171 at a first side of the matrix 170 and to first inputs of the fifth and sixth NAND gates 164 and 165 at a second opposite side on the matrix 170. The seventh and ninth horizontal leads 171 are connected to second inputs of the fifth and sixth NAND gates 164 and 165, respectively. The State 1 input signal is received via bus 107 from the State Storage device 106 and coupled to the eleventh horizontal lead 171 at a first side of the matrix 170 and to first inputs of the seventh and eighth NAND gates 166 and 167 at a second opposite side on the matrix 170. The tenth and twelfth horizontal leads 171 are connected to second inputs of the seventh and eighth NAND gates 166 and 167, respectively. The State 0 input signal is received via bus 107 from the State Storage device 106 and coupled to the fourteenth horizontal lead 171 at a first side of the matrix 170 and to first inputs of the ninth and tenth NAND gates 168 and 169 at a second opposite side on the matrix 170. The thirteenth and fifteenth horizontal leads 171 are connected to second inputs of the ninth and tenth NAND gates 168 and 169, respectively. The first and second NAND gates 160 and 161 generate tran4u and tran4l output signals, respectively.

Similarly, the third and fourth NAND gates 162 and 163 generate tran3u and tran3l output signals, respectively, the fifth and sixth NAND gates 164 and 165 generate tran2u and tran2l output signals, respectively, the seventh and eighth NAND gates 166 and 167 generate tran1u and tran1l output signals, respectively, the ninth and tenth NAND gates 168 and 169 generate tran0u and tran0l output signals, respectively. The five tran0u–tran4u and the five tran0l–tran4l output signals are transmitted via bus 103 (shown in FIG. 10) to the transition arrangement 104 (shown in FIG. 10).

In operation, it is assumed that at the current moment a state machine in the controller 100 of FIG. 10 is in state 2 (a high on the State 2 lead 171), and that the state 2 shall be exited if the input signal IN4 to the evaluation arrangement 102 is high (e.g. a logical 1). In this case the input signal IN4 is connected via connection 174 (as is shown within the circle 177) to the same NAND gate 164 as the State 2 signal. When the State 2 signal is high, the tran2u output signal from NAND gate 164 will go low (e.g., a logical "0"). This indicates that the state machine is about to exit state 2. If state 2 has to be exited under a condition that the IN4 signal is low, then the negated IN4 signal from inverter 154 would be connected to the NAND gate 165 via a connection (not shown within the circle 178) made between the tenth vertical and ninth horizontal lead of the matrix 170.

For other conditions, a connection (not shown) between the eleventh vertical lead 172 (coupled to the VEXT from the external power supply) and a predetermined one of the NAND gates 160–169 would be made when the state diagram called for an unconditional transfer to that next associated state. A connection between the twelfth vertical lead 172 (coupled to ground) and a predetermined associated pairs of the NAND gates 160–169 associated with a particular state would be made when the state diagram called for a blocked transition, as is shown between the first and third horizontal leads 171 and the twelfth vertical lead 172 for State 4.

Figure 13:
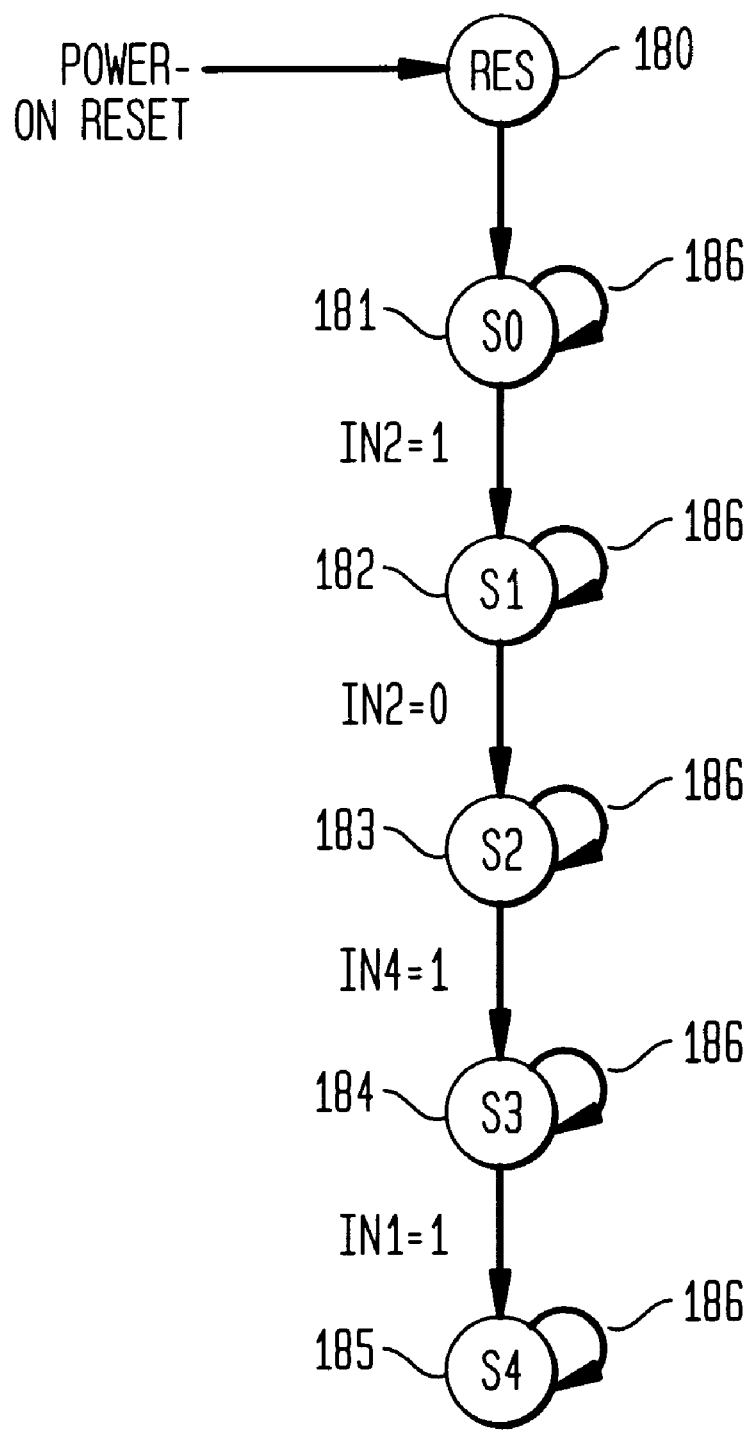
FIG. 13 shows a state diagram for explaining the operation and structure of the exemplary evaluation arrangement of FIG. 12.

Referring now to FIG. 13, there is shown an exemplary linear state diagram comprising five states for use in describing the operation and structure of the exemplary evaluation arrangement 102 shown in FIG. 12. At the beginning, usually at power-on, the state machine is being reset (RES) as shown in circle 180. This means that all flip-flops (shown in FIG. 11) are being reset with the ASRES signal. This mode is not considered a "real" state. From the RES condition in circle 180, the state machine transitions unconditionally into state S0 shown in circle 181. From this point forward the conditions denoted below each state needs to be fulfilled in order for the state machine to continue from one state to the next. If a transition condition is not fulfilled, the state machine stays in the current state, as is indicated by a "circle arrow" 186.

When the state machine is in State 0 and the transition condition of IN2=1 is fulfilled, the following occurs in the evaluation arrangement 102 of FIG. 12. The State 0 signal is high (a logical "1") on the fourteenth horizontal lead 171, and the IN2 signal is high on the fifth vertical lead 172 and low on the sixth vertical lead 172 of the matrix 170 because of the inverter 152. The connection 173 between the fifth vertical lead 172 and the thirteenth horizontal lead 171 places highs (logical "1s") on both input of the NAND gate 168 to cause the output thereof to change from a high to a low output. The NAND gate 169 is unaffected because one of its inputs in connected to ground via permanent connection 173 between the twelfth vertical lead 172 (ground) and the fifteenth horizontal lead 171 and provides a high tran0l signal. This output from NAND gate 168 indicates that a transition out of State 0 to the next State (state 1) is to be made. Once in State 1, indicated by circle 182, when the transition condition of IN2=0 occurs, a high will be applied to both the eleventh horizontal lead (State 1), and the sixth vertical lead 172 via inverter 152 in FIG. 12. The connection 173 between the sixth vertical lead 172 and the twelfth horizontal lead 171 and the Stated 1 signal causes high (logical 1) signals to be applied to both inputs of NAND gate 167. The output from the NAND gate 167 will go from a high output signal to a low output signal. The NAND gate 166 only has one high input (State 1) and a second input to NAND gate 166 is connected to ground via connection 173 on the tenth horizontal lead 171. The output from NAND gate 167 indicates a transition out of State 1 to the next State (state 2) is to be made.

Once in State 2 indicated by circle 183, when the transition condition of IN4=1 occurs, a high will be applied to both the eighth horizontal lead 171 (State 2), and the ninth vertical lead 172. The high State 2 signal and the connection 173 shown within circle 177 between the ninth vertical lead 172 and the seventh horizontal lead 171 causes high (logical 1) signals to be applied to both inputs of NAND gate 164. This causes the output tran2u signal from NAND gate 164 to change from high to low value and indicates a transition out of State 2 to the next State (state 3) is to be made. The output of NAND gate 165 associated with State 2 does not change from its high output because one of its inputs is connected to ground via permanent connection 173 between the twelfth vertical lead 172 and the ninth horizontal lead 171.

Once in State 3, indicated by circle 184, when the transition condition of IN1=1 occurs, a high will be applied to both the fifth horizontal lead 171 (State 3), and the third vertical lead 172. The high State 3 signal and the connection 173 between the third vertical lead 172 and the fourth horizontal lead 171 causes high (logical 1) signals to be applied to both inputs of NAND gate 162. This causes the output of NAND gate 162 to change from high to low and indicates a transition out of State 3 to the next State (state 4). The output of NAND gate 163 associated with State 3 does not change because one it the inputs is connected to ground via permanent connection 173 between the twelfth vertical lead 172 and the sixth horizontal lead 171.

Once in State 4 indicated by circle 185, the state machine has completed the transitions through the exemplary state diagram of FIG. 13. There is no transition out of State 4 because both NAND gates 160 and 161 have one of their inputs connected to ground via permanent connections 173 shown between the twelfth vertical lead and the first and third horizontal leads 171 of the matrix 170.

The above processing technique allows for the identification of which state has to be exited, and identifies whether the state should be exited because exactly one input variable (e.g., IN4) is true or false. This very basic evaluation information is all that is needed in order to realize a universal state diagram if the necessary transformations have been performed. If a state is to be exited unconditionally (not shown in FIG. 12 but occurs from the RES state of FIG. 13), then one of the two NAND gates associated with that state to be exited would be permanently connected to the supply voltage VEXT. If the state diagram ends in one state and there is no transition from this state to any other state, then the NAND gates (e.g., NAND gates 160 and 161) associated with this state are connected to ground (low).

Figure 14:
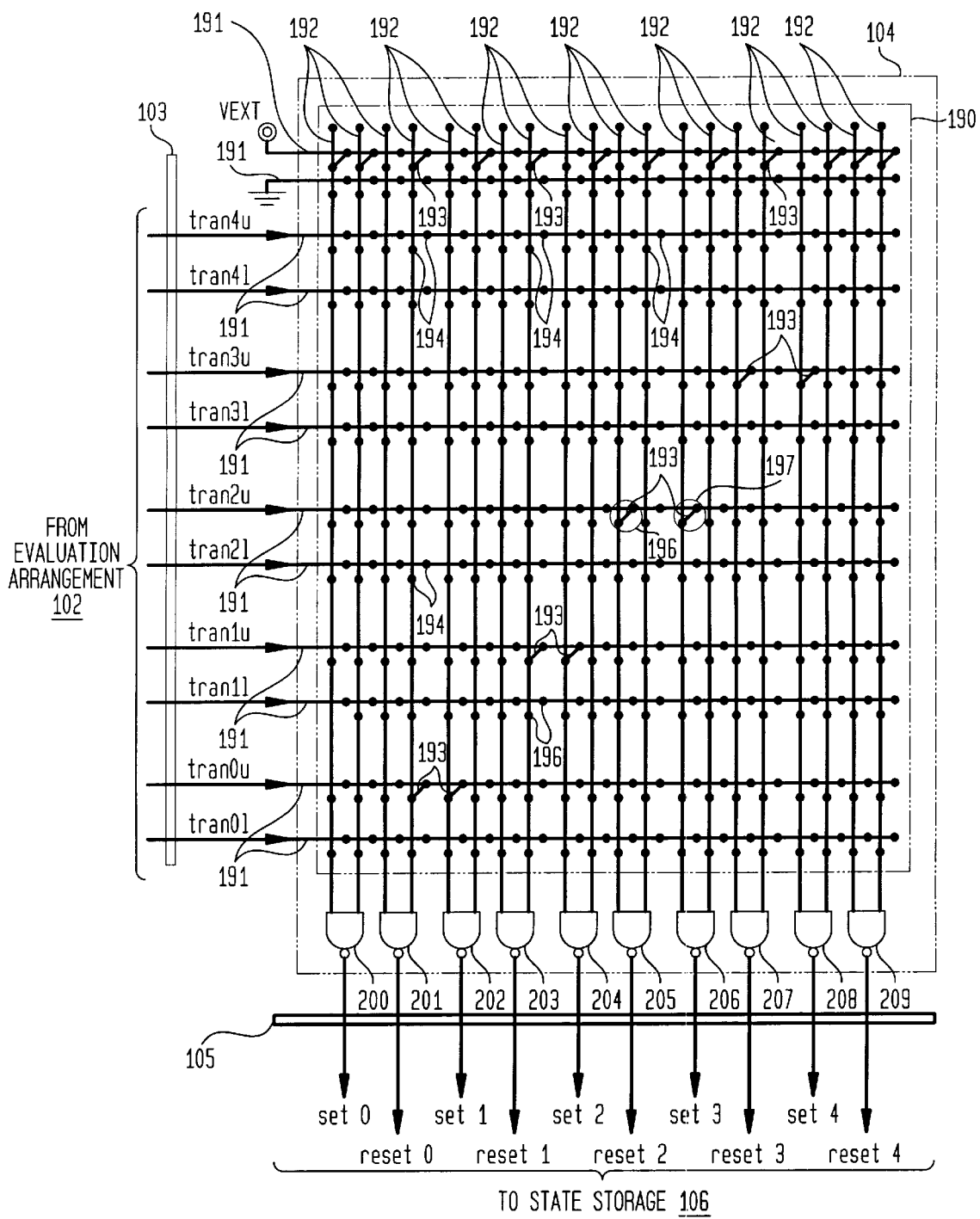
FIG. 14 shows a circuit diagram for an exemplary transition arrangement forming part of the controller of FIG. 10 in accordance with the present invention.

Referring now to FIG. 14, there is shown a circuit diagram for an exemplary transition arrangement 104 (shown within a dashed line rectangle) forming part of the controller 100 of FIG. 10 in accordance with the present invention. The exemplary transition arrangement 104 is coupled to receive each of five tran0u–tran4u signals and five tran0l–tran4l signals from the exemplary evaluation arrangement 102 shown in FIG. 12 via bus 103, and to transmit each of five set0–set4 signals and five reset0–reset4 signals to the state storage device 106 shown in FIG. 10 via bus 105. The exemplary transition arrangement 104 comprises an exemplary matrix 190 (shown within a dashed line rectangle) and ten NAND gates 200–209. It is to be understood that the transition arrangement 104 can comprise many more input signals and a larger matrix 190 when the evaluation arrangement 102 is larger than shown in FIG. 12 and transmits more input signals to the transition arrangement 104.

The matrix 190 comprises twelve parallel horizontal leads 191 that are connectable to predetermined ones of twenty parallel vertical leads 192 by separate permanent connectors 193. A potential (VEXT) from a remote power source (not shown) is coupled to the first (top) horizontal lead 191 of the matrix 190, and ground potential is applied to the second horizontal lead 191 of the matrix 190. The tran4u, tran3u, tran2u, tran1u, and tran0u input signals from the evaluation arrangement 102 are coupled to the third, fifth, seventh, ninth, and eleventh horizontal leads 191, respectively, of the matrix 190. The tran4l, tran3l, tran2l, tran1l, and tran0l input signals from the evaluation arrangement 102 are coupled to the fourth, sixth, eighth, tenth, and twelfth horizontal leads 191 of the matrix 190. First and second inputs of each of the ten NAND gates 200–209 are coupled to separate ones of the twenty vertical leads 192 of the matrix 190. For example, the NAND gate 200 has its first and second inputs coupled to the first and second vertical leads 192, respectively, the NAND gate 201 has its first and second inputs coupled to the third and fourth vertical leads 192, respectively, the NAND gate 202 has its first and second inputs coupled to the fifth and sixth vertical leads 192, respectively, etc, with the last NAND gate 209 having its first and second inputs coupled to the nineteenth and twentieth vertical leads 192, respectively. NAND gates 200, 202, 204, 206, and 208 provide the output signals set0, set1, set2, set3, and set 4, respectively, while the NAND gates 201, 203, 205, 207, and 209 provide the output signals reset0, reset1, reset2, reset3, and reset4, respectively.

The following example describes a typical operation of the transition arrangement 104. It is assumed that there is a transition from State 2 to State 3. For a transition out of State 2, the tran2u signal coupled to the seventh horizontal lead of the matrix 190 or the tran2l signal coupled to the eighth horizontal lead of the matrix 190 could go low for a transition out of State 2. As was described for the evaluation arrangement 102 of FIG. 12, the tran2u signal is the received low signal for a transition out of State 2, while all of the other input signals from the evaluation arrangement 102 remain high. The low tran2u signal is coupled to a first input of the NAND gate 205 via the connection shown within the circle 196 while a high VEXT potential is permanently coupled to the second input of the NAND gate 205 via permanent connection 193 coupling the first horizontal lead 191 to the twelfth vertical lead 192. The low and high inputs to NAND gate 205 generates a high reset2 output signal to the state storage device 106 (shown in FIGS. 10 and 11) via bus 105. Concurrently, the low tran2u signal is coupled to a first input of the NAND gate 206 via the permanent connection 193 shown within the circle 197, while VEXT is applied to a second input of NAND gate 206. This causes the NAND gate 206 to generate a high set3 output signal. The high reset2 output signal is transmitted via bus 105 to the state storage device 106 for resetting the state flip-flop 110 therein that is associated with the Set-Reset Flip-Flop 110 representing State 2. Concurrently, the high set3 output signal is transmitted via bus 105 to the state storage device 106 for setting the state flip-flop 110 therein that is associated with the Set-Reset Flip-Flop 110 representing State 3.

Where a state flip-flop 110 in the state storage device 106 is not used, then both inputs to the respective set and reset NAND gates in the transition arrangement 104 via associated the vertical leads 192 of matrix 190 would be connected to ground potential (low) on the second horizontal lead 191 via a permanent connection (not shown). This maintains the state flip-flop 110 in the state storage device 106 in a reset state after an initial power-on mode reset (ASRES). If a state diagram ends in one state and there is no further transition from this state to any other state, then the two inputs to the NAND gate that generates a reset signal of this state are coupled to the supply potential VEXT (high). Thus, the reset signal will always be low and this state will not be reset once this state has been reached. This is shown in FIG. 14 for NAND gate 209 associated with State 4.

Figure 15:
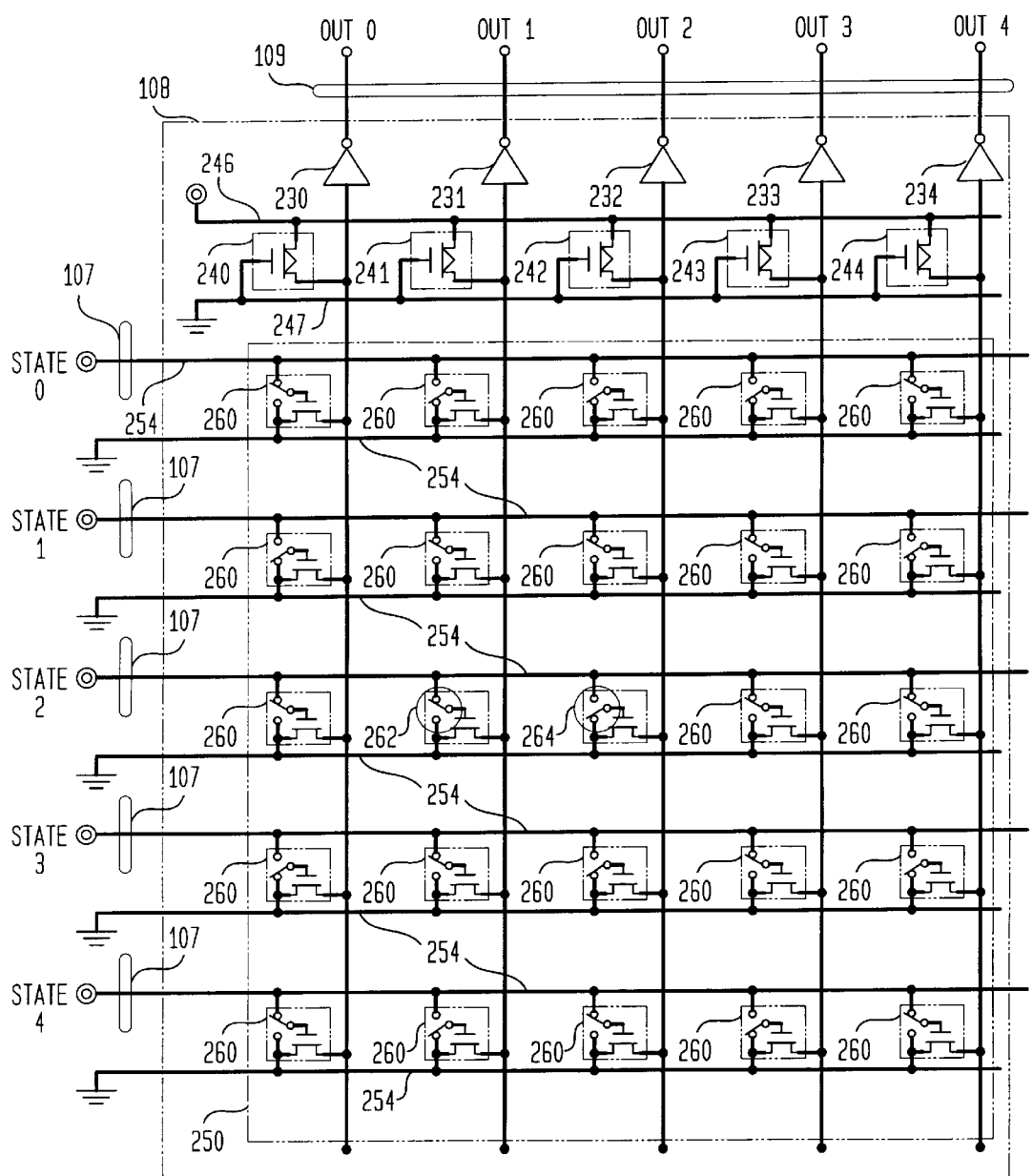
FIG. 15 shows a circuit diagram for an exemplary output arrangement forming part of the controller of FIG. 10 in accordance with the present invention.

Referring now to FIG. 15, there is shown a circuit diagram for an exemplary output arrangement 108 (shown within a dashed line rectangle) forming part of the controller 100 of FIG. 10 in accordance with the present invention. The exemplary output arrangement 108 comprises first, second, third, fourth, and fifth inverters 230–234, first, second, third, fourth, and fifth Positive Field Effect Transistor (PFET) devices 240–244 (shown within separate dashed line rectangles), and a matrix 250 (shown within a dashed line rectangle). The PFET devices 240–244 and associated with the inverters 230–234, respectively. Each of the PFET devices 240–244 has a source electrode thereof coupled to a predetermined externally provided voltage (VEXT) via lead 246, a gate electrode thereof coupled to ground via lead 247, and a drain electrode thereof coupled to an input of the associated one of the inverters 230–234. The arrangement of each of the PFETs 240–244 causes a high input (VEXT) to be provided to an input of the associated one of the inverters 230–234 which, without further signals being applied to the inverters 230–234, causes the inverters to maintain a low output. Therefore, the PFETs 240–244 can be designated as a pull-up PFET device.

The matrix 250 comprises first, second, third, fourth, and fifth vertical leads 252 coupled at one end to the first, second, third, fourth, and fifth inverters 230–234, respectively, ten horizontal leads 254, and twenty five Negative Field Effect Transistor (NFETs) devices 260 (shown within separate dashed line rectangles) located at crossing areas of the vertical leads 252 and horizontal leads 254 within the matrix 250. The first, third, fifth, seventh, and ninth horizontal leads 254 of the Matrix 250 are coupled to ground potential at one end thereof, and the second, fourth, sixth, eighth, and tenth horizontal leads are coupled to receive State 0, State 1, State 2, State 3, and State 4 input signals, respectively, via bus 107 from the State Storage device 106 (shown in FIGS. 10 and 11). The gates of each of the NFET devices 260 can be either coupled to ground potential in order to deactivate the NFET device 260, or to a respective one of State 0–4 input signals to the matrix 250. If the gate of an NFET device 260 is coupled to an active State input signal which is high (e.g., logical 1), it causes the low ground potential to be coupled to the vertical lead 252 associated with that NFET device 260 so that the input of the associated Inverter (e.g., inverter 230) is pulled to a low level when the State is active. Therefore, the associated inverter (e.g., inverter 230) will generate a high output signal on a bus 109 when the State signal is active. The output signals generated by the inverters 230–234 are directed via bus 109 to various circuits in a remote generator system on, for example, a DRAM chip.

For example, if State 2 is active, then a high on the fifth horizontal lead 254 will be applied to the gate 260 of the NFET device 260 (shown within circle 262) coupling the fifth horizontal lead 254 to the second vertical lead 252 associated with inverter 231. The gate 260 causes ground potential from the sixth horizontal lead 254 to be coupled to the second vertical lead 252 which pulls down the input signal to the inverter 231 and causes the inverter 231 to generates a high output signal (OUT1) on the bus 109. The active State 2 signal also causes the inputs of each of the inverters 230, 233, and 234 to be pulled down to ground potential because the State 2 signal is coupled to the gates of the NFET devices 260 coupling the fifth horizontal lead 254 to the first, fourth, and fifth vertical leads 252. Since the gate of the NFET device 260 (shown within the circle 264) coupling the fifth horizontal lead 254 to the third vertical lead 252 associated with inverter 232 is always connected to ground potential, then NFET device 260 is always deactivated when the State 2 signal is active. Therefore, when the State 2 signal is active, the input to the inverter 232 remains in the pulled up condition caused by the PFET device 242, and the inverter 232 continues to output a low output signal (OUT2) over the bus 109. Since only one State input signal is active at a time, there is no other NFET device 260 in the Matrix 250 that would pull the input to the inverter 232 down when the State 2 input signal is active. With the arrangement shown for each of the NFET devices 260 of the Matrix 250 and the description hereinabove explaining what occurs for an active State 2 signal, it can easily be determined which of the inverters 230–234 will be pulled down or up when any one of the other State input signal become active.

Figure 16A:
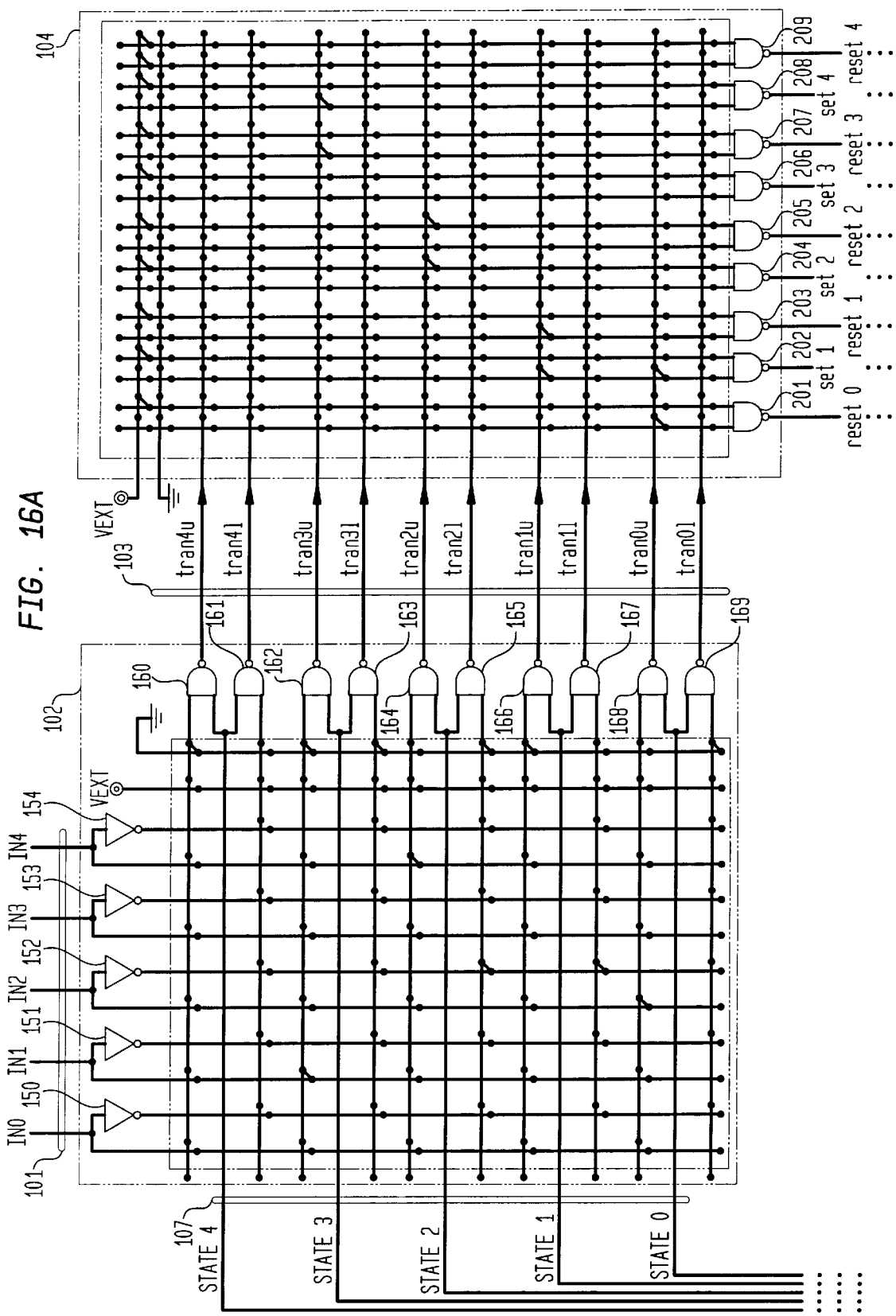
FIGS. 16A and 16B show an overall arrangement of the exemplary controller of FIG. 10 including the circuitry for the state storage device, the evaluation arrangement, and the transition arrangement, shown in FIGS. 11, 12, and 14, respectively, for operation with an exemplary linear state diagram comprising 5 states as is shown in FIG. 13 in accordance with the present invention.
Figure 16B:
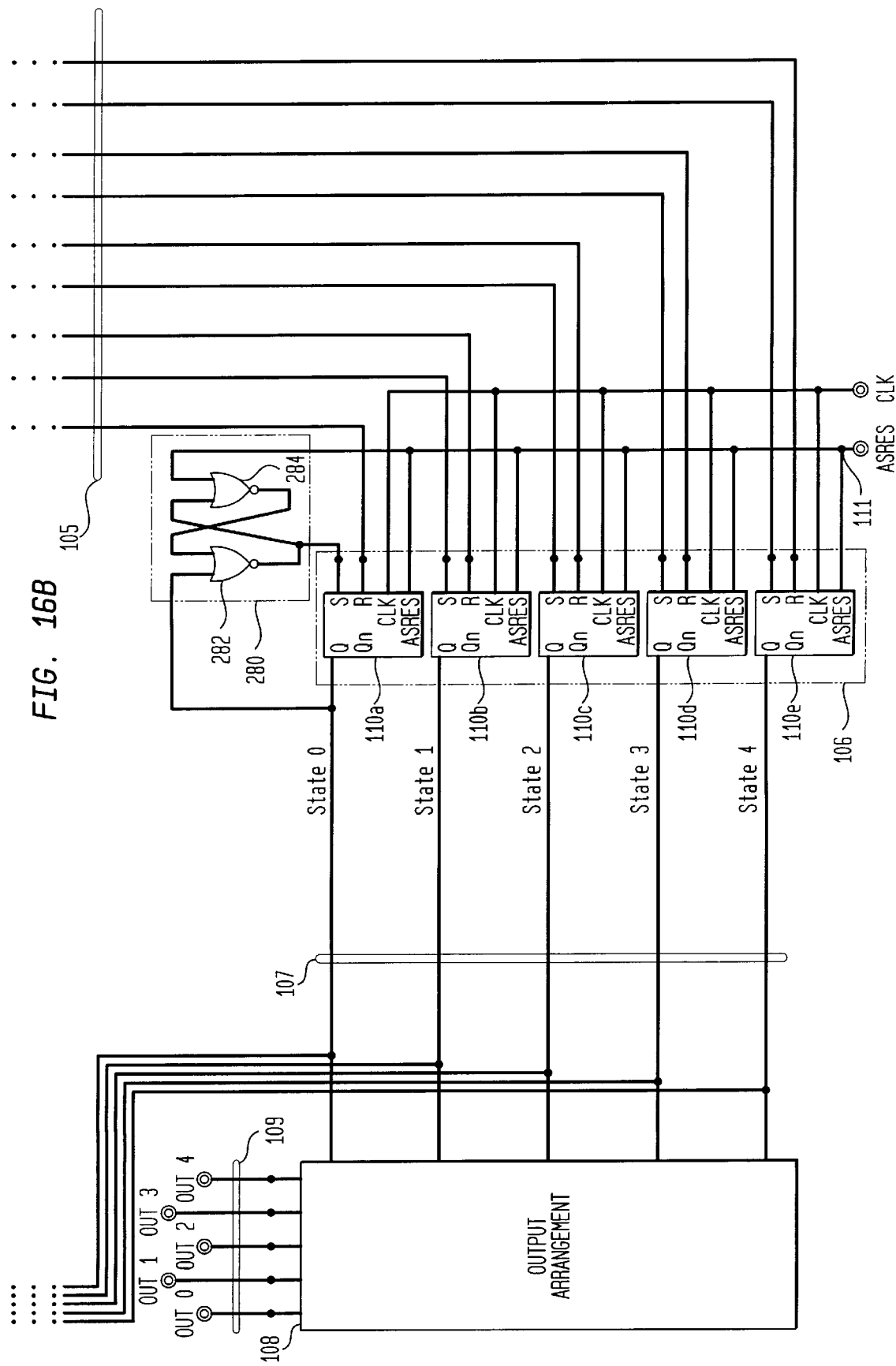

Referring now to FIGS. 16A and 16B, there is shown an overall arrangement of the exemplary controller 100 (shown within a dashed line rectangle) of FIG. 10 including circuitry for the state storage device 106, the evaluation arrangement 102, and the transition arrangement 104 as shown in FIGS. 11, 12, and 14, respectively, for operation with an exemplary linear state diagram comprising 5 states (S0–S4) as is shown in FIG. 13 for the evaluation arrangement 102 in accordance with the present invention. More particularly, the exemplary controller 100 of FIGS. 16A and 16B is capable of handling five states (States 0–4), five input signal signals (IN0–IN4), and five output signals (OUT0–OUT4). The evaluation arrangement 102 comprises five inverters 150–154, ten NAND gates 160–169, and a matrix 170. The evaluation arrangement 102 receives five input signals IN0–IN4 via bus 101 from remote devices (not shown), and five State signals (State 1–State 5) via bus 107 from a state storage device 106. The evaluation arrangement 102 generates one of tran0u–tran4u or tran0l–tran4l output signals via bus 103 at any instant of time to the transition arrangement 104. The evaluation arrangement 102 corresponds to the arrangement shown in FIG. 12, and the operation thereof corresponds to that described hereinbefore for the evaluation arrangement 102 in accordance with the linear state diagram of FIG. 13.

The transition arrangement 104 is shown as comprising nine NAND gates 201–209 and a matrix 190. The transition arrangement 104 receives any of the tran0u–tran4u and tran0l–tran4l output signals from the Evaluation arrangement 102 via bus 103, and generates predetermined ones of SET1–SET4 or RESET0–RESET4 output signals via bus 105 to the state storage device 106. The arrangement of the transition arrangement 104 corresponds to that shown in FIG. 14, except that the NAND gate 200 of FIG. 14 was not included in the transition arrangement 104 shown in FIG. 16A. The reason for this omission is that in FIG. 14, the NAND gate 200 is made inactive by the permanent coupling of both inputs to the VEXT potential. Therefore, the NAND gate 200 never provides a SET0 output signal to the state storage device 106.

The state storage device 106 comprises five Set-Reset Flip-Flops (SR F/F) 110a–110e, where each of the SR F/Fs comprises the circuitry shown in FIG. 12. An additional remote flip-flop 280 comprising NOR gates 282 and 284 are also provided for the state storage device 106.

At the beginning of the operation of the exemplary controller 100, the controller 100 is reset (usually at power-on). An Asynchronous Reset (ASRES) input signal (also known as a RESET signal) to the state storage device 106 goes high and then low again. This resets all flip-flops 110a–110e in the state storage device 106. This "mode" is not a "real" state according to a coding definition of the associated state machine in accordance with the present invention because in each state exactly one flip-flop (110a–110e) in the state storage device 106 has to be set, and all other flip-flops have to be reset. The additional two NOR gates 282 and 284 in additional flip-flop 280 ensures that after the initial reset the first state flip-flop 110a (for State 0) is being set. This happens unconditionally and the state machine is now in State 0. Once this has occurred, the evaluation of the input signals IN0–IN4 in the evaluation arrangement 102, the transitions through all states in transition arrangement 104, and the generation of the appropriate output signals OUT0–OUT1 can happen as described hereinbefore. It should be noted that the input signals IN0 and IN3 are not used and are not connected to any node in the evaluation arrangement 102. Still further, the state machine stays in State 4 once this state has been reached. Therefore, the tran4u and tran4l output signals from the evaluation arrangement 102 are not connected to any node in the transition arrangement 104. Additionally, the RESET4 output signal from the transition arrangement 104 is always forced to be low by connecting the two inputs of the NAND gate 209 to the supply voltage VEXT.

Figure 17:
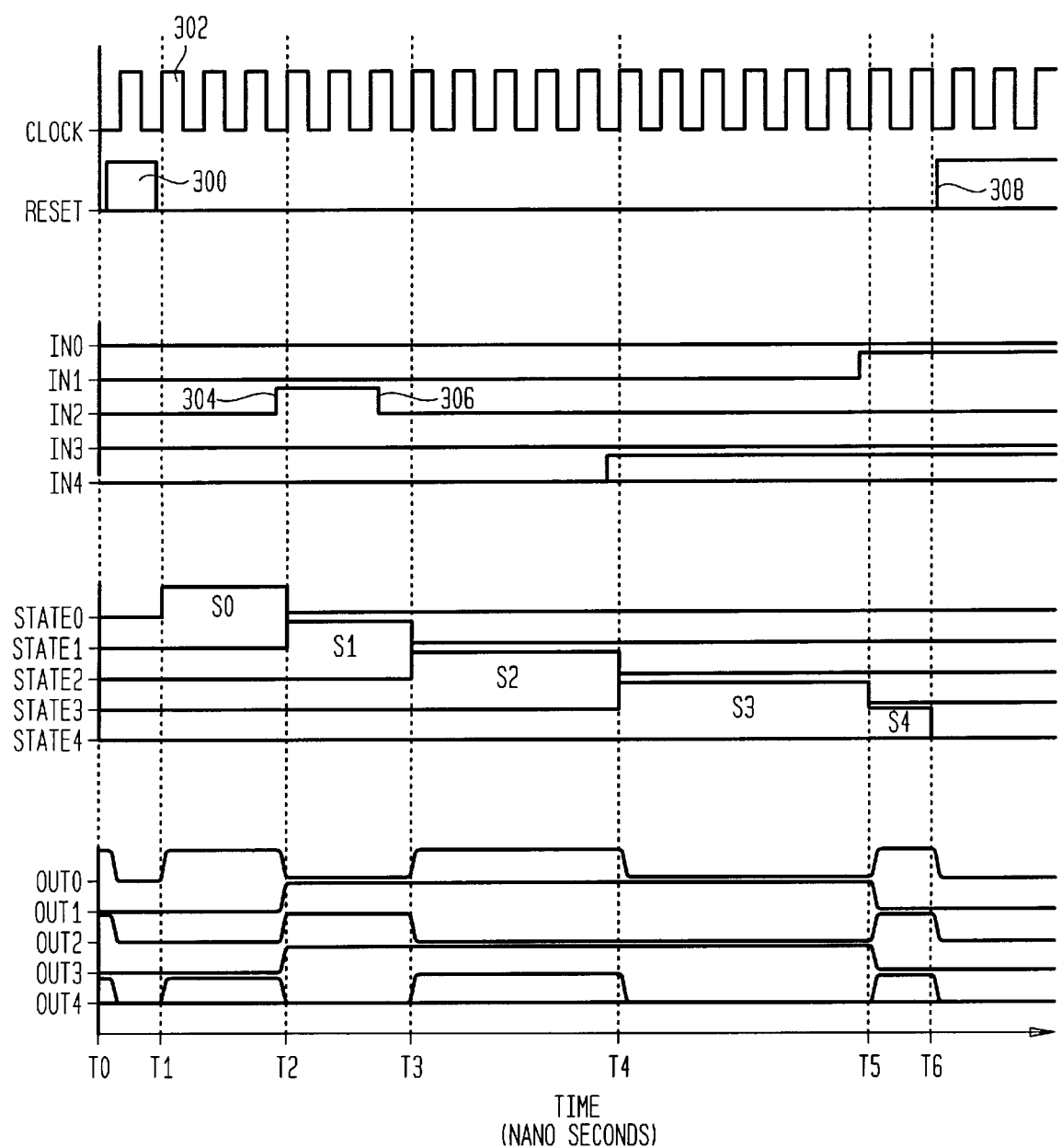
FIG. 17 shows a timing diagram of the simulation results of the exemplary controller of FIG. 16 as the controller realizes the exemplary linear state diagram of FIG. 14 in accordance with the present invention.

Referring now to FIG. 17, there is shown a timing diagram of waveforms of a clock signal, a Reset signal (also known as an ASRES signal), IN0–IN4 signals, State 0–4 signals, and OUT0–OUT4 signals resulting in the exemplary controller 100 of FIGS. 16 and 16B as the controller 100 realizes the exemplary linear state diagram comprising States 0–4 of FIG. 14 in accordance with the present invention. At time=0 (T0) a Reset pulse 300, corresponding to an Asynchronous Reset (ASRES) signal, resets all flip-flops 110a–110e in the state storage device 106. With a first rising clock edge 302 at T1 after the reset pulse 300, the state machine enters state S0. Between times T1 and T2, the State 0 signal is the only state signal that is active from the state storage device 106, and results in output signals OUT0 and OUT4 from the output arrangement 108 to become high. This can be seen in FIG. 15, where the State 0 signal activates the NFETs 260 associated with the inverters 230 and 234 to cause a low (ground) to be applied to the inverters 230 and 234 to generate a high OUT0 and OUT4 output signal.

Just prior to time T2, an IN2 signal goes positive (IN2=1) which causes the state machine to transition into State 1, because the condition for transitioning from State 0 to State 1 has occurred as is shown in FIG. 13. The time between the beginning of the rise 304 in IN2 and the transition to state 2 at time T2 occurs because of the processing time of the IN2 signal in the evaluation arrangement 102 for generating the proper tran0u output signal via bus 103 as shown in FIG. 12, and the transition arrangement 104 generating the proper RESET0 and SET1 output signals to the state storage device 106 via bus 105. During the active State 1 (S1) signal from the state storage device, the output arrangement 108 generates high OUT1, OUT2, and OUT3 output signals over bus 109. As is shown in FIG. 13, once the state machine is in State 1 and the IN2 input signal goes low, the condition has been met for a transition from state 1 to state 2. In FIG. 17 the IN2 signal is shown as having a falling edge 306 just prior to time T3. As a result of IN2 going low, the evaluation arrangement 102 generates a tran1u output signal to the transition arrangement 104, and the transition arrangement 104 generates a RESET1 and a SET2 output signal to the state storage device 106 for a transition from state 1 to state 2 at time T3. During the time from T3 to T4 when the state 2 (S2) is high, the output arrangement 108 generates high OUT0 and OUT4 signals via bus 109. A similar operation occurs for transitioning from state 2 to state 3 at time T4 just after IN4 goes high, and from state 3 to state 4 at time T5 after IN1 goes high where different output signals (OUT0–OUT4) are accordingly generated. Once the state machine is in state 4 (S4) it remains there (as shown in FIG. 13) until another RESET signal 308 is generated at time T6 at which time the sequence starts again.

Figure 18:
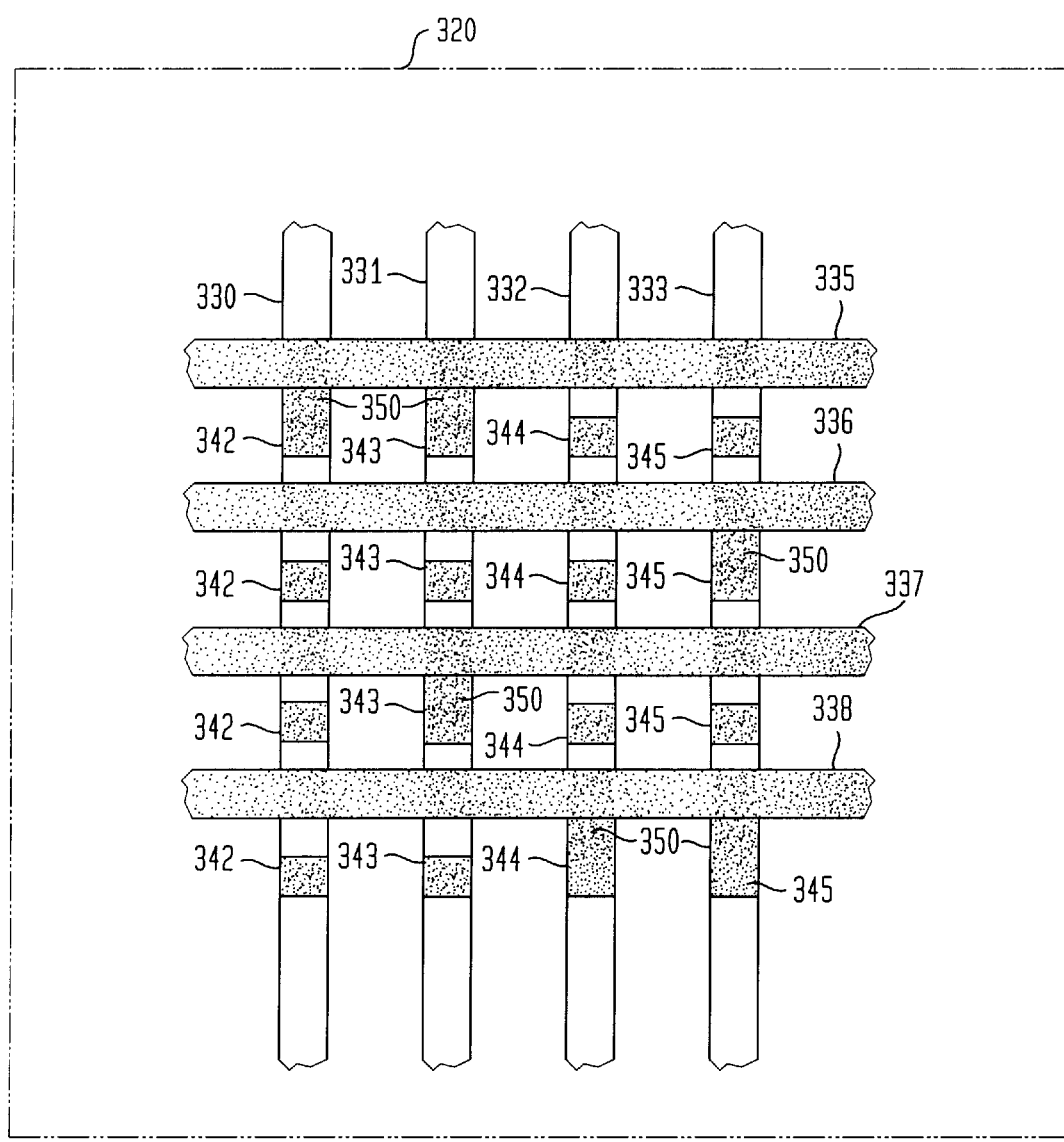
FIG. 18 shows an exemplary arrangement of a partial matrix which can be used in the evaluation arrangement and/or the transition arrangement of FIGS. 12 and 14, respectively, in accordance with the present invention.

Referring now to FIG. 18, there is shown an exemplary arrangement of a partial matrix 320 (shown within a dashed line rectangle) which can be used in the evaluation arrangement 102 and/or the transition arrangement 104 of FIGS. 12 and 14, respectively, in accordance with the present invention. The partial matrix 320 comprises first, second, third, and fourth vertical electrically conductive metal lines 330, 331, 332, and 333, respectively, first, second, third, and fourth horizontal electrically conductive metal lines 335, 336, 337, and 338, respectively, a separate set of first, second, third, and fourth electrically conductive contacts 342, 343, 344, and 345, respectively, which are formed on the respective first, second, third, and fourth vertical electrically conductive metal lines 330, 331, 332, and 333 below each of the first, second, third, and fourth horizontal electrically conductive metal lines 335, 336, 337, and 338. A desired connection can easily be made between a particular one of the vertical electrically conductive metal lines 330, 331, 332, and 333 and a particular one of the horizontal electrically conductive metal lines 335, 336, 337, and 338 by adding a piece of electrically conductive material 350 that couples the vertical metal line to the desired horizontal metal line as shown, for example, between metal contact 342 on the first vertical metal line 330 and the first horizontal metal line 335. A simple addition or removal of a piece of electrically conductive material 350 to make or break a connection between a vertical and horizontal metal line allows for programming changes in a late stage of a design project. It also allows a designer to alter the behavior of the controller 100 by a "metal-fix", which means a cost effective design change can be made that involves only one metal layer.

As one embodiment of the present invention, the horizontal lines 335–339 can comprise a first type of metal conductor, and the vertical lines 330–333 can comprise a second type of metal conductor where the metal connector 350 comprises either one of the first or second type of metal conductor. It is another embodiment of the present invention that any other contact arrangement can be used for making contact between a particular vertical metal line (330–333)

and a particular horizontal metal line (335–339) to provide a a cost effective design change to be made involving the addition or removal of only one metal layer. Such contact arrangement can be used in place of the contacts 342–345 and the connectors 345 shown in FIG. 18. The contact arrangement can be used in any one or all of the evaluation arrangement 102, the transition arrangement 104, and the output arrangement 108 (where the NFETs 260 of FIG. 15 are replaceable by a suitable contact arrangement).

Since the controller 100 of FIGS. 10 and 16 has a highly regular structure, it is easily possible to lay out parallel signal lines (e.g., lines for all state signals S0–S4, all transition signals tran0u–tran4u and tran0l to tran4l, etc.) in an identical way. This will provide the parallel signal lines in buses 103, 105, and 107 substantially identical parasitic resistance values and capacitive loads. Thus a signal delay on these lines will be identical. This allows for an easy determination of the critical path within the controller 100, and a determination of a safe maximum operating frequency.

The advantages of the present controller 100 are as follows. First, the output arrangement 108 can be realized in a very regular and simple structure, Since there is always exactly one state signal that is high, no combinational logic is needed in order to decode the output state signals from the flip-flops 110a–110n in the state storage device 106. If a combinational logic would be needed, the signals from the flip-flops 110a–110n could have different delay times through the output arrangement 108. This could cause errors in the output signals, and to avoid such errors it would be necessary to synchronize the output signals to the clock signal.

Second, for an evaluation of the input signals (IN0–IN4) in the evaluation arrangement 102, it is not necessary to decode the state signals (S0–S4) from the state storage device 106 since a 1-out-of-N state coding allows an easy logical combining of the state information (state 0–state 4) with the input information (IN0–IN4).

Third, it must be ensured that a state machine starts properly at the power-on mode of operation. This includes resetting of all flip-flops 110a–110n in the state storage device 106 to their "start value", and that there is no timing violation (with respect to the clock) when the RESET (or ASRES) signal ends. If such actions are not met, it could happen that in the first transition from the "Reset state" to the first state, all of the flip-flops 110a–110n that are supposed to switch may not do so. This can cause the state machine to go into either a wrong state or into an undefined state. The present controller 100 arrangement avoids this possibility since the transition from the "Reset state" (all flip-flops 110a–110n are reset) into the first state (S0) resets exactly one flip-flop and is done in a safe manner. If there is a set-time/hold-time violation in the controller 100 when the RESET pulse ends, then this exactly one flip-flop will either switch with the current clock edge or it will switch with the next clock edge (delay of one clock cycle). In either case, no wrong or undefined state will be entered.

Fourth, an important aspect of the present invention is that in the structure of the state machine, there is a clear separation between the evaluation arrangement 102 and the transition arrangement 104. Every transition between two states is characterized by exactly one transition signal (tran0u–tran4u and tran0l–tran4l) going low. This transition signal causes the setting of the next-state flip-flop (one of 110a–110n) and a resetting of the current-state flip-flop. With only one transition signal causing the setting and resetting operation in the flip-flops 110a–110n, any possible timing violation is substantially without consequence. Either the setting/resetting occurs with a current clock edge, or both the setting/resetting will be delayed by one clock cycle. No wrong or undefined state will occur. This safety is additionally increased (statistically) by the fact that only two flip-flops (1-out-of-N coding) are involved in any state transition. Thus there is a savings of additional circuitry for input signal synchronization and the use in the controller 100 of unsynchronized signals.

Fifth, a characteristic of the controller 100 is that the output signals (IN0–IN4) are only dependent on the State signals, an not on the input signals (IN0–IN4). If the controller were dependent on the input signals, the generation of the output signals would not be as simple as afforded by the controller 100. Combinatorial logic circuitry would be necessary to combine state signals (S0–S4) and input signals (IN0–IN4). Then, if unsynchronized input signals are used, this could lead to unacceptable errors in the output signals, and a requirement for synchronization circuitry for the output signals (IN0–IN4).

Sixth, a most important aspect of the present controller 100 is that it can be "programmed" (or "configured") in a very late state of a design project as is shown, for example, in FIG. 18.

It is to be appreciated and understood that the specific embodiments of the invention described hereinabove are merely illustrative of the general principles of the invention. Various modifications may be made by those skilled in the art which are consistent with the principles set forth. For example, any one or all of the evaluation arrangement 102, the transition arrangement 104, the state storage device 106, and the output arrangement 108 can be comprise any other suitable arrangement that operates in the manner described hereinbefore for each of those elements while permitting an easy programming change in a late stage of a design and a same operational security.

What is claimed is:

1. A controller for controlling a generator system on a memory chip, the controller operating as a state machine in accordance with a state diagram including a plurality of X states, and comprising:

an evaluation arrangement for evaluating a combination of only a predetermined one of a plurality of N input signals from remote devices and only a predetermined one of a plurality of X state signals indicating a current state in the state diagram for the controller at any instant of time, and generating a separate predetermined one of a plurality of Y output signals having a predetermined logical value which is different than that of the remaining plurality of Y output signals for indicating that a change from one state to a next state in the state diagram is to be made when the predetermined one of the plurality of N input signals and the predetermined one of the plurality of X state signals comprise a predetermined logical condition;

a state storage device which in responsive to the predetermined one of a plurality of Y output signals having a predetermined logical value from the evaluation arrangement generates a revised plurality of X state output signals for transmission to the evaluation arrangement indicating a change in the state diagram from a current state to a next state of the plurality of X states; and an output arrangement responsive to the revised plurality of X state output signals from the state storage device for generating separate predetermined ones of M output signals associated with said next state for controlling the generator system.

2. The controller of claim 1 further comprising a transition arrangement responsive to the predetermined one of a plurality of Y output signals from the evaluation arrangement for generating an output signal to the state storage device indicating that a change from one state to a next state in the state diagram is to be made.

3. The controller of claim 2 wherein the evaluation arrangement comprises:

an evaluation matrix comprising a group of parallel first conductive lines and a group of parallel second conductive lines which are orthogonal to each other and overlap at predetermined locations, the plurality of X state signals being coupled for reception at separate first ends of the group of first conductive lines, and the plurality of N input signals from the remote devices being coupled for reception at first ends of a separate set of first and second conductive lines of the group of parallel second conductive lines so that the associated parallel first conductive line of each set is coupled to provide the associated input signal with a first logical value, and the parallel second conductive line of each set is coupled to provide the associated input signal with a second logical value; and a plurality of two-input logical gates coupled to second ends of a separate subgroup of the group of parallel second conductive lines which are coupled to receive the plurality of X state signals, each of the plurality of logical gates providing (a) an output signal having a first logical value when either one of the associated one of the state signals coupled to a first input of the logical gate and an associated one of the input signals coupled to a second input of the logical gate do not have a second logical value, and (b) an output signal having a second logical value when the associated one of the state signals and the one of the input signals have a second logical value.

4. The evaluation arrangement of claim 3 wherein:

each of the plurality of two-input logical gates comprise a NAND gate, where a separate set of two NAND gates is associated with a separate one of the plurality of X state signals, each NAND gate is coupled at a first input thereof to receive an associated state signal, and is coupled at a second input thereof to a separate parallel line of the group of parallel first conductive lines coupled to receive the plurality of X state signals; and the evaluation matrix comprises selectively placed connection arrangements at predetermined crosspoints of the evaluation matrix for selectively coupling a predetermined second conductive line to a predetermined one of the first conductive lines leading coupled to a second input of a predetermined NAND gate.

5. The evaluation arrangement of claim 4 wherein the connection arrangements comprise separate electrically conductive connectors that are selectively addable or removable from coupling a predetermined first and second conductive line of the evaluation matrix when a change is to be made in a design of the controller.

6. The evaluation arrangement of claim 3 further comprising a plurality of N inverters, each inverter comprising an input for receiving a separate one of the plurality of N input signals, and an output which is coupled at a first end of the associated parallel second conductive line of a separate set of the group of parallel second conductive lines for generating an inverted logical value of the associated input signal for transmission on the associated parallel second conductive line of each set of parallel second conductive lines.

7. The controller of claim 2 wherein the transition arrangement comprises:

a transition matrix comprising a group of parallel first conductive lines and a group of parallel second conductive lines which overlap at predetermined locations to provide crosspoints, wherein connection arrangements are selectively provided at predetermined crosspoints between the second conductive lines and the first conductive lines, the plurality of Y output signals from the evaluation arrangement being coupled for reception at separate first ends of the group of parallel first conductive lines; and a plurality of two-input logical gates wherein each input of each of said logical gates is coupled to a separate conductive line of the group of parallel second conductive lines and is coupled to one of a group consisting of (a) one of a separate one of the plurality of Y input signals, (b) a predetermined first potential level from a remote voltage source, or (c) a second potential level such as ground potential, the plurality of two-input logical gates being associated in pairs for generating a set and a reset output signal having first logical values that indicate when a change from one state to an next state in the state diagram is to be made.

8. The controller of claim 1 wherein the state storage device comprises:

a plurality of X set-reset flip-flop (S-R F/F) arrangements where each S-R F/F arrangement is associated with a separate state of the state diagram, each S-R F/F arrangement being responsive to a separate (a) set output signal from the transition arrangement associated with a separate one of the plurality of X state signals for generating a state output signal indicating that the associated state in the state diagram is now entered, and (b) reset output signal from the transition arrangement associated with a separate one of the plurality of X state signals for generating a state output signal indicating that the associated state in the state diagram is exited.

9. The state storage device of claim 8 wherein each S-R F/F arrangement comprises:

a first inverter for receiving a remotely generated clock signal and generating an inverted clock output signal;

a second inverter for receiving a remotely generated asynchronous reset (ASRES) signal and generating therefrom an inverted ASRES output signal;

a first set-reset flip-flop (S-R F/F) stage coupled to receive (a) the associated reset and set output signals from the transition arrangement associated with a separate one of the plurality of X states of the state diagram at first and second inputs, respectively, (b) the inverted clock output signal from the first inverter, (c) the received ASRES signal, and (d) the inverted ASRES output signal from the second inverter, for generating from said received signals predetermined set and reset output signals at first and second outputs of the first S-R F/F stage;

a second set-reset flip-flop (S-R F/F) stage coupled to receive (a) the predetermined first and second output signals from the first S/R FF stage, (b) the received clock signal, (c) the received ASRES signal, and (d) the inverted ASRES output signal from the second inverter, for generating from said received signals predetermined first and second output signals representing a status of a separate one of the plurality of X state output signals from the state storage device.

10. The state storage device of claim 9 wherein:

when the received ASRES signal has a logical "1" value, then the first S-R F/F stage and the second S-R F/F stage in each of the plurality of X set-rest flip-flop arrangements are locked to generate logical "0" output signals independent of the logical values of the set and reset input signals and the received clock signal to ensure a proper reset of all first and second S-R F/F stages when entering the state diagram; and when the received ASRES signal has a logical "0" value, then each of the first and second S-R F/F stages operate in a predetermined manner dependent on the logical values of the set and reset input signals and the received clock signal.

11. The state storage device of claim 9 wherein:

as long as the received clock signal has a logical "0" value, the first S-R F/F stage stores the logical values of the received set and reset input signals from the transition arrangement associated with a separate predetermined state of the state diagram;

as long as the received clock signal has a logical "1" value, the first S-R F/F stage is locked in its current condition and the second S-R F/F stage is unlocked to receive and store therein current logical values of the set and reset signals stored in the first S-R F/F stage; and when the received clock signal rises from a logical "0" value to a logical "1" value, the first S-R F/F stage is made operational for transferring current logical values stored therein to the second S-R F/F stage, and any changes in the set and reset output signals from the transition arrangement do not affect logical values stored in the first S-R F/F stage.

12. The state storage device of claim 9 wherein each first set-reset flip-flop (S-R F/F) stage comprises:

a first NAND gate comprising a first input, a second input, and an output, the first and second inputs being coupled to receive the associated reset output signal from the transition arrangement and the inverted clock signal from the first inverter, respectively;

a second NAND gate comprising a first input, a second input, and an output, the first and second inputs being coupled to receive the associated set output signal from the transition arrangement and the inverted clock signal from the first inverter, respectively;

a third NAND gate comprising a first input, a second input, and an output, the first and second inputs being coupled to the output from the first NAND gate and the inverted ASRES signal from the second inverter, respectively;

a NOR gate comprising a first input, a second input, and an output, the first and second inputs being coupled to the output from the second NAND gate and the received ASRES signal, respectively; and a NOR set-reset flip-flop (NOR S-R F/F) comprising a first input, a second input, a first output, and a second output, the first and second inputs being coupled to the outputs from the third NAND gate and the NOR gate, respectively, and the first and second outputs are coupled to first and second inputs of the second set-reset flip-flop (S-R F/F) stage.

13. The first set-reset flip-flop (S-R F/F) stage of claim 12 wherein the NOR S-R F/F comprises:

a first NOR gate and a second NOR gate wherein a first input of the first and second NOR gates is coupled to the output from the third NAND gate and the NOR gate, respectively, a second input of the first and second NOR gates are coupled to an output of the second and first NOR gates, respectively, and the outputs of the first and second NOR gates are coupled to second and first inputs of the second set-reset flip-flop (S-R F/F) stage.

14. The state storage device of claim 9 wherein each second set-reset flip-flop (S-R F/F) stage comprises:

a first NAND gate comprising a first input, a second input, and an output, the first and second inputs being coupled to receive the associated reset output signal from the first S-R F/F stage and the received clock signal, respectively;

a second NAND gate comprising a first input, a second input, and an output, the first and second inputs being coupled to receive the associated set output signal from the first S-R F/F stage and the received clock signal, respectively;

a third NAND gate comprising a first input, a second input, and an output, the first and second inputs being coupled to the output from the first NAND gate and to receive the inverted ASRES signal from the second inverter, respectively;

a NOR gate comprising a first input, a second input, and an output, the first and second inputs being coupled to the output from the second NAND gate and to receive the received ASRES signal, respectively; and a NOR set-reset flip-flop (NOR S-R F/F) comprising a first input, a second input, a first output and a second output, the first and second inputs being coupled to outputs from the third NAND gate and the NOR gate, respectively, and the first and second outputs transmit a state signal that represent a status of an associated state.

15. The second set-reset flip-flop (S-R F/F) stage of claim 12 wherein the NOR S-R F/F comprises:

a first NOR gate and a second NOR gate wherein a first input of the first and second NOR gate is coupled to the output from the third NAND gate and the NOR gate, respectively, a second input of the first and second NOR gate is coupled to an output of the second and first NOR gates, respectively, and the outputs of the first and second NOR gates provide the state signal that represent the status of the associated state.

16. The controller of claim 1 wherein the output arrangement comprises:

an output matrix comprising:

a group of parallel first conductive lines coupled to receive the plurality of X state output signals from the state storage device at separate first ends of a group of parallel first conductive lines:

a group of parallel second conductive lines which are orthogonal to the group of parallel first conductive lines and overlap the group of parallel first conductive lines at predetermined crosspoints; and first connection devices, each first connection device being associated with a separate crosspoint between the groups of parallel first and second conductive lines for selectively coupling a predetermined separate one of the first conductive lines to ground potential when a predetermined one of the received plurality of X state output signals from the state storage device is received as a logical "1" signal;

a plurality of M inverters, each inverter being coupled to a second end of a separate second conductive line for providing a separate one of the plurality of M output signals for controlling the generator system: and a plurality of M second connection devices, each connection device being associated with a separate one of the conductive lines of the group of parallel second conductive lines for coupling an input of the inverter that is coupled to a same second end of the separate conductive line of the group of the parallel second conductive lines to a logical "1" signal.

17. The output arrangement of claim 16 wherein the first connection devices comprise separate Negative Field Effect Transistors (NFET), each NFET comprising a gate electrode is selectively coupled to either (a) receive the associated state input signal for causing ground potential to be applied to the associated conductive line of the group of parallel second conductive lines when the state input signal comprises a logical "1" value, or (b) ground potential to prevent the NFET from ever applying ground potential to the associated conductive line of the group of parallel second conductive lines regardless of the logical value of the associated state input signal.

18. The output arrangement of claim 16 wherein the second connection devices comprise separate Positive Field Effect Transistors (PFET), each PFET comprising a gate electrode which is selectively coupled to ground potential, and source and drain electrodes which are coupled between a predetermined logical "1" potential and the associated conductive line of the group of parallel second conductive lines for coupling the predetermined logical "1" potential to the input of the inverter coupled to the second end of the separate conductive line of the group of the parallel second conductive lines.

19. A controller for controlling a remote system on a memory chip which operates in accordance with a state diagram including a plurality of X states, the controller comprising:

an evaluation arrangement that is responsive at any instant of time for evaluating only one of a plurality of N input signals to the controller from remote devices in relation to only one of a plurality of X state signals, and generating one of a plurality of Y output signals that has a predetermined logical value for entering a next state in the state diagram when a condition has been met wherein the one state signal and the one input signal have met predetermined logical conditions;

a state storage device which, in response to the one of a plurality of Y output signals that has a predetermined logical value from the evaluation arrangement, generates a revised plurality of X state output signals for transmission back to the evaluation arrangement indicating a change in the state diagram from a current state to a next state of the plurality of X states; and an output arrangement responsive to the revised plurality of X state output signals from the state storage device for generating separate predetermined ones of M output signals associated with said next state for controlling the generator system.

20. The controller of claim 19 further comprising a transition arrangement responsive to the predetermined one of a plurality of Y output signals from the evaluation arrangement for generating an output signal indicating that a change from one state to a next state in the state diagram is to be made.

21. The controller of claim 20 wherein the evaluation arrangement comprises:

an evaluation matrix comprising a group of parallel first conductive lines and a group of parallel second conductive lines which are orthogonal to each other and overlap at predetermined locations, the plurality of X state signals being coupled for reception at separate first ends of the group of first conductive lines, and the plurality of N input signals from the remote devices being coupled for reception at first ends of a separate set of first and second conductive lines of the group of parallel second conductive lines so that the associated parallel first conductive line of each set is coupled to provide the associated input signal with a first logical value, and the parallel second conductive line of each set is coupled to provide the associated input signal with a second logical value; and a plurality of two-input logical gates coupled to second ends of a separate subgroup of the group of parallel second conductive lines which are coupled to receive the plurality of X state signals, each of the plurality of logical gates providing (a) an output signal having a first logical value when either one of the associated one of the state signals coupled to a first input of the logical gate and an associated one of the input signals coupled to a second input of the logical gate do not have a second logical value, and (b) an output signal having a second logical value when the associated one of the state signals and the one of the input signals have a second logical value.

22. The evaluation arrangement of claim 21 wherein:

each of the plurality of two-input logical gates comprise a NAND gate, where a separate set of two NAND gates is associated with a separate one of the plurality of X state signals, each NAND gate is coupled at a first input thereof to receive an associated state signal, and is coupled at a second input thereof to a separate parallel line of the group of parallel first conductive lines coupled to receive the plurality of X state signals; and the evaluation matrix comprises selectively placed connection arrangements at predetermined crosspoints of the evaluation matrix for selectively coupling a predetermined second conductive line to a predetermined one of the first conductive lines leading coupled to a second input of a predetermined NAND gate.

23. The evaluation arrangement of claim 22 wherein the connection arrangements comprise separate electrically conductive connectors that are selectively addable or removable from coupling a predetermined first and second conductive line of the evaluation matrix when a change is to be made in a design of the controller.

24. The evaluation arrangement of claim 21 further comprising a plurality of N inverters, each inverter comprising an input for receiving a separate one of the plurality of N input signals, and an output which is coupled at a first end of the associated parallel second conductive line of a separate set of the group of parallel second conductive lines for generating an inverted logical value of the associated input signal for transmission on the associated parallel second conductive line of each set of parallel second conductive lines.

25. The controller of claim 20 wherein the transition arrangement comprises:

a transition matrix comprising a group of parallel first conductive lines and a group of parallel second conductive lines which overlap at predetermined locations to provide crosspoints, wherein connection arrangements are selectively provided at predetermined crosspoints between the second conductive lines and the first conductive lines, the plurality of Y output signals from the evaluation arrangement being coupled for reception at separate first ends of the group of parallel first conductive lines; and a plurality of two-input logical gates wherein each input of each of said logical gates is coupled to a separate conductive line of the group of parallel second conductive lines and is coupled to one of a group consisting of (a) one of a separate one of the plurality of Y input signals, (b) a predetermined first potential level from a remote voltage source, or (c) a second potential level such as ground potential, the plurality of two-input logical gates being associated in pairs for generating a set and a reset output signal having first logical values that indicate when a change from one state to an next state in the state diagram is to be made.

26. The controller of claim 20 wherein the state storage device comprises:

a plurality of X set-reset flip-flop (S-R F/F) arrangements where each S-R F/F arrangement is associated with a separate state of the state diagram, each S-R F/F arrangement being responsive to a separate (a) set output signal from the transition arrangement associated with a separate one of the plurality of X state signals for generating a state output signal indicating that the associated state in the state diagram is now entered, and (b) reset output signal from the transition arrangement associated with a separate one of the plurality of X state signals for generating a state output signal indicating that the associated state in the state diagram is exited.

27. The state storage device of claim 26 wherein each S-R F/F arrangement comprises:

a first inverter for receiving a remotely generated clock signal and generating an inverted clock output signal;

a second inverter for receiving a remotely generated asynchronous reset (ASRES) signal and generating therefrom an inverted ASRES output signal;

a first set-reset flip-flop (S-R F/F) stage coupled to receive (a) the associated reset and set output signals from the transition arrangement associated with a separate one of the plurality of X states of the state diagram at first and second inputs, respectively, (b) the inverted clock output signal from the first inverter, (c) the received ASRES signal, and (d) the inverted ASRES output signal from the second inverter, for generating from said received signals predetermined set and reset output signals at first and second outputs of the first S-R F/F stage;

a second set-reset flip-flop (S-R F/F) stage coupled to receive (a) the predetermined first and second output signals from the first S/R FF stage, (b) the received clock signal, (c) the received ASRES signal, and (d) the inverted ASRES output signal from the second inverter, for generating from said received signals predetermined first and second output signals representing a status of a separate one of the plurality of X state output signals from the state storage device.

28. The state storage device of claim 27 wherein:

when the received ASRES signal has a logical "1" value, then the first S-R F/F stage and the second S-R F/F stage in each of the plurality of X set-rest flip-flop arrangements are locked to generate logical "0" output signals independent of the logical values of the set and reset input signals and the received clock signal to ensure a proper reset of all first and second S-R F/F stages when entering the state diagram; and when the received ASRES signal has a logical "0" value, then each of the first and second S-R F/F stages operate in a predetermined manner dependent on the logical values of the set and reset input signals and the received clock signal.

29. The state storage device of claim 27 wherein:

as long as the received clock signal has a logical "0" value, the first S-R F/F stage stores the logical values of the received set and reset input signals from the transition arrangement associated with a separate predetermined state of the state diagram;

as long as the received clock signal has a logical "1" value, the first S-R F/F stage is locked in its current condition and the second S-R F/F stage is unlocked to receive and store therein current logical values of the set and reset signals stored in the first S-R F/F stage; and when the received clock signal rises from a logical "0" value to a logical "1" value, the first S-R F/F stage is made operational for transferring current logical values stored therein to the second S-R F/F stage, and any changes in the set and reset output signals from the transition arrangement do not affect logical values stored in the first S-R F/F stage.

30. The state storage device of claim 27 wherein each first set-reset flip-flop (S-R F/F) stage comprises:

a first NAND gate comprising a first input, a second input, and an output, the first and second inputs being coupled to receive the associated reset output signal from the transition arrangement and the inverted clock signal from the first inverter, respectively;

a second NAND gate comprising a first input, a second input, and an output, the first and second inputs being coupled to receive the associated set output signal from the transition arrangement and the inverted clock signal from the first inverter, respectively;

a third NAND gate comprising a first input, a second input, and an output, the first and second inputs being coupled to the output from the first NAND gate and the inverted ASRES signal from the second inverter, respectively;

a NOR gate comprising a first input, a second input, and an output, the first and second inputs being coupled to the output from the second NAND gate and the received ASRES signal, respectively; and a NOR set-reset flip-flop (NOR S-R F/F) comprising a first input, a second input, a first output, and a second output, the first and second inputs being coupled to the outputs from the third NAND gate and the NOR gate, respectively, and the first and second outputs are coupled to first and second inputs of the second set-reset flip-flop (S-R F/F) stage.

31. The first set-reset flip-flop (S-R F/F) stage of claim 30 wherein the NOR S-R F/F comprises:

a first NOR gate and a second NOR gate wherein a first input of the first and second NOR gates is coupled to the output from the third NAND gate and the NOR gate, respectively, a second input of the first and second NOR gates are coupled to an output of the second and first NOR gates, respectively, and the outputs of the first and second NOR gates are coupled to second and first inputs of the second set-reset flip-flop (S-R F/F) stage.

32. The state storage device of claim 27 wherein each second set-reset flip-flop (S-R F/F) stage comprises:

a first NAND gate comprising a first input, a second input, and an output, the first and second inputs being coupled to receive the associated reset output signal from the first S-R F/F stage and the received clock signal, respectively;

a second NAND gate comprising a first input, a second input, and an output, the first and second inputs being coupled to receive the associated set output signal from the first S-R F/F stage and the received clock signal, respectively;

a third NAND gate comprising a first input, a second input, and an output, the first and second inputs being coupled to the output from the first NAND gate and to receive the inverted ASRES signal from the second inverter, respectively;

a NOR gate comprising a first input, a second input, and an output, the first and second inputs being coupled to the output from the second NAND gate and to receive the received ASRES signal, respectively; and a NOR set-reset flip-flop (NOR S-R F/F) comprising a first input, a second input, a first output and a second output, the first and second inputs being coupled to outputs from the third NAND gate and the NOR gate, respectively, and the first and second outputs transmit a state signal that represent a status of an associated state.

33. The second set-reset flip-flop (S-R F/F) stage of claim 30 wherein the NOR S-R F/F comprises:

a first NOR gate and a second NOR gate wherein a first input of the first and second NOR gate is coupled to the output from the third NAND gate and the NOR gate, respectively, a second input of the first and second NOR gate is coupled to an output of the second and first NOR gates, respectively, and the outputs of the first and second NOR gates provide the state signal that represent the status of the associated state.

34. The controller of claim 20 wherein the output arrangement comprises:

an output matrix comprising:
a group of parallel first conductive lines coupled to receive the plurality of X state output signals from the state storage device at separate first ends of a group of parallel first conductive lines:
a group of parallel second conductive lines which are orthogonal to the group of parallel first conductive lines and overlap the group of parallel first conductive lines at predetermined crosspoints; and
first connection devices, each first connection device being associated with a separate crosspoint between the groups of parallel first and second conductive lines for selectively coupling a predetermined separate one of the first conductive lines to ground potential when a predetermined one of the received plurality of X state output signals from the state storage device is received as a logical "1" signal;

a plurality of M inverters, each inverter being coupled to a second end of a separate second conductive line for providing a separate one of the plurality of M output signals for controlling the generator system: and a plurality of M second connection devices, each connection device being associated with a separate one of the conductive lines of the group of parallel second conductive lines for coupling an input of the inverter that is coupled to a same second end of the separate conductive line of the group of the parallel second conductive lines to a logical "1" signal.

35. The output arrangement of claim 34 wherein the first connection devices comprise separate Negative Field Effect Transistors (NFET), each NFET comprising a gate electrode is selectively coupled to either (a) receive the associated state input signal for causing ground potential to be applied to the associated conductive line of the group of parallel second conductive lines when the state input signal comprises a logical "1" value, or (b) ground potential to prevent the NFET from ever applying ground potential to the associated conductive line of the group of parallel second conductive lines regardless of the logical value of the associated state input signal.

36. The output arrangement of claim 34 wherein the second connection devices comprise separate Positive Field Effect Transistors (PFET), each PFET comprising a gate electrode which is selectively coupled to ground potential, and source and drain electrodes which are coupled between a predetermined logical "1" potential and the associated conductive line of the group of parallel second conductive lines for coupling the predetermined logical "1" potential to the input of the inverter coupled to the second end of the separate conductive line of the group of the parallel second conductive lines.

37. A method of controlling a generator system on a memory chip with a controller operating as a state machine in accordance with a state diagram including a plurality of X states, comprising the steps of:

(a) evaluating only one of a plurality of N input signals from remote devices in relation to only one of a plurality of X state signals in an evaluation arrangement at any instant of time;

(b) generating one of a plurality of Y output signals from the evaluation arrangement having a predetermined logical value indicating that a next state is to be entered in the state diagram when a condition has been met wherein the one state signal and the one input signal that are being evaluated have met predetermined logical conditions;

(c) generating a revised plurality of X state output signals in a state storage device in response to the plurality of Y output signals from the evaluation arrangement in step (b) for transmission back to the evaluation arrangement indicating a change in the state diagram from a current state to a next state of the plurality of X states; and (d) generating separate predetermined ones of a plurality of M output signals in an output arrangement that are associated with said next state for controlling the generator system in response to the revised plurality of X state output signals from the state storage device in step (c).

38. The method of claim 37 comprising the further step of:

(e) prior to performing step (c), receiving the predetermined one of a plurality of Y output signals from the evaluation arrangement in a transition arrangement for generating an output signal to the state storage device indicating that a change from one state to a next state in the state diagram is to be made.

39. The method of claim 38 wherein the transition arrangement comprises a transition matrix which comprises a plurality of first parallel conductive leads and a plurality of second conductive leads that are orthogonal to each other and have crosspoints at overlapping points thereof, wherein programming changes are made in the transition matrix by adding or removing a connector arrangement at any of the crosspoints at any time period in a design of the controller.

40. The method of claim 38 wherein the state storage device comprises a plurality of X set-reset flip-flop (S-R F/F) arrangements where each S-R F/F arrangement is associated with a separate one of the X states of the state diagram, and in performing step (c), performing the substeps of:

(c1) generating a state output signal in a S-R F/F arrangement indicating that the associated state in the state diagram is now entered when the S-R F/F arrangement receives a separate set output signal from the transition arrangement associated with a corresponding one of the plurality of X state signals: and (c2) generating a state output signal in a S-R F/F arrangement indicating that the associated state in the state diagram is exited when the S-R F/F arrangement receives a separate reset output signal from the transition arrangement associated with a corresponding one of the plurality of X state signals.

41. The method of claim 37 wherein the evaluation arrangement comprises an evaluation matrix comprising a plurality of first parallel conductive leads and a plurality of second conductive leads that are orthogonal to each other and have crosspoints at overlapping points thereof, wherein programming changes are made in the evaluation matrix by adding or removing a connector arrangement at any of the crosspoints at any time period in a design of the controller.

42. The method of claim 38 wherein the state storage device is responsive to a clock signal and set and reset signals forming the output signal from the transition arrangement for a predetermined state in the state diagram, the state storage device comprising a plurality of X Set-Reset Flip-Flop (S-R F/F) arrangements comprising a separate first and second S-R F/F stage coupled in series for each of the plurality of X states, and in performing step (c) performing the substep of:

(c1) storing logical values of the received set and reset input signals from the transition arrangement associated with a separate predetermined state of the state diagram in the first S-R F/F stage as long as the received clock signal has a logical "0" value;

(c2) locking the first S-R F/F stage in its current condition, and unlocking the second S-R F/F stage to receive and store therein current logical values of set and reset signals stored in the first S-R F/F stage as long as the received clock signal has a logical "1" value; and (c3) transferring current logical values stored in the first S-R F/F stage to the second S-R F/F stage when the received clock signal rises from a logical "0" value to a logical "1" value at which time any changes in the set and reset output signals from the transition arrangement do not affect logical values stored in the first S-R F/F stage.

43. The method of claim 42 wherein the state storage device is responsive to an asynchronous reset (ASRES) input signal and set and reset signals forming the output signal from the transition arrangement comprising the further substeps of:

(c4) locking the first S-R F/F stage and the second S-R F/F stage in each of the plurality of X set-rest flip-flop arrangements when the received ASRES signal has a logical "1" value for generating a logical "0" output signal independent of the logical values of the set and reset input signals and the received clock signal to ensure a proper resetting of all of the first and second S-R F/F stages when entering the state diagram; and (c5) operating each of the first and second S-R F/F stages in a predetermined manner dependent on the logical values of the set and reset input signals and the received clock signal to the first S-R F/F stage when the received ASRES signal has a logical "0" value.

44. The method of claim 37 wherein in performing step (d), the output arrangement comprises an output matrix which comprises a plurality of first parallel conductive leads for (a) receiving the plurality of X state signals from the state storage device (b) a separate logical "1" signal, and (c) a separate ground potential signal to separate ones of the first parallel conductive leads, and a plurality of second conductive leads that are orthogonal to the first parallel conductive leads and have crosspoints at overlapping points thereof, the second conductive leads suppling logical signals to first ends thereof for generating the plurality of M output signals, wherein programming changes are made in the transition matrix by changing a connector arrangement at any of the crosspoints at any time period in a design of the controller.

45. The method of claim 44 wherein first connection devices between at each crosspoint of the output matrix comprises a separate Negative Field Effect Transistors (NFET) comprising a gate electrode, and in performing step (d) performing the substeps of:

(d1) selectively connecting a first conductive line associated with a predetermined state input signal to the gate of a predetermined NFET for causing ground potential to be applied to the associated conductive line of the group of parallel second conductive lines at the associated crosspoint in the output matrix when the state input signal comprises a logical "1" value;

(d2) selectively connecting ground potential to the gate of a predetermined NFET at a predetermined crosspoint in the output matrix for preventing the NFET from ever applying ground potential to the associated conductive line of the group of parallel second conductive lines regardless of the logical value of the associated state input signal.

46. The method of claim 45 wherein the output matrix further comprises separate inverters coupled to first ends of the each of the conductive lines of the group of parallel second conductive lines, and second connection devices comprising separate Positive Field Effect Transistors (PFET), each PFET comprising a gate electrode, a source electrode, and a drain electrode, and in performing step (d), performing the further substep of:

(d3) selectively coupling the gate of each PFET to ground potential, and the source and drain electrodes are coupled between a predetermined logical "1" potential and the associated conductive line of the group of parallel second conductive lines for coupling the predetermined logical "1" potential to the input of the inverter coupled to the second end of the separate conductive line of the group of the parallel second conductive lines.

* * * * *